United States Patent
Chou

(10) Patent No.: US 10,741,488 B2
(45) Date of Patent: Aug. 11, 2020

(54) SEMICONDUCTOR DEVICE WITH INTEGRATED CAPACITOR AND MANUFACTURING METHOD THEREOF

(71) Applicant: TAIWAN SEMICONDUCTOR MANUFACTURING COMPANY LTD., Hsinchu (TW)

(72) Inventor: Chung-Yen Chou, Hsinchu (TW)

(73) Assignee: TAIWAN SEMICONDUCTOR MANUFACTURING COMPANY LTD., Hsinchu (TW)

(*) Notice: Subject to any disclaimer, the term of this patent is extended or adjusted under 35 U.S.C. 154(b) by 0 days.

(21) Appl. No.: 15/901,342

(22) Filed: Feb. 21, 2018

(65) Prior Publication Data

US 2019/0103352 A1 Apr. 4, 2019

Related U.S. Application Data

(60) Provisional application No. 62/566,000, filed on Sep. 29, 2017.

(51) Int. Cl.
| H01L 23/522 | (2006.01) |
| H01L 21/768 | (2006.01) |
| H01L 23/528 | (2006.01) |
| H01L 49/02 | (2006.01) |

(52) U.S. Cl.
CPC .... *H01L 23/5223* (2013.01); *H01L 21/76879* (2013.01); *H01L 23/5283* (2013.01); *H01L 28/40* (2013.01)

(58) Field of Classification Search
CPC combination set(s) only.
See application file for complete search history.

(56) References Cited

U.S. PATENT DOCUMENTS

| 5,538,592 | A | * | 7/1996 | Chen | ................ | H01L 27/10817 |
| | | | | | | 438/396 |
| 5,774,326 | A | | 6/1998 | McConnelee et al. | | |
| 7,659,176 | B2 | | 2/2010 | Coolbaugh et al. | | |
| 9,064,719 | B1 | | 6/2015 | Zhou et al. | | |
| 9,224,800 | B2 | * | 12/2015 | Cho | | |

(Continued)

FOREIGN PATENT DOCUMENTS

| CN | 1520599 A | 8/2004 |
| CN | 1988083 A | 6/2007 |
| CN | 101989621 A | 3/2011 |

OTHER PUBLICATIONS

Office Action of Taiwanese counterpart application 107119483 from TIPO dated Dec. 23, 2019.

(Continued)

*Primary Examiner* — Hrayr A Sayadian
(74) *Attorney, Agent, or Firm* — WPAT, P.C., Intellectual Property Attorneys; Anthony King

(57) ABSTRACT

A semiconductor structure includes a capacitor including a first electrode and a second electrode disposed over and electrically insulated from the first electrode. The semiconductor structure also includes a first conductive via extending through the first electrode and contacting a planar surface of the first electrode. The semiconductor structure further includes a second conductive via extending through the second electrode and contacting a planar surface of the second electrode.

8 Claims, 20 Drawing Sheets

(56) References Cited

U.S. PATENT DOCUMENTS

| | | |
|---|---|---|
| 2010/0224960 A1 | 9/2010 | Fischer |
| 2011/0070718 A1 | 3/2011 | Kim et al. |
| 2012/0286395 A1 | 11/2012 | Fischer |
| 2013/0258545 A1 | 10/2013 | Yano et al. |
| 2014/0035100 A1 | 2/2014 | Cho |
| 2015/0037960 A1 | 2/2015 | Chang et al. |
| 2015/0102459 A1 | 4/2015 | Lai et al. |
| 2017/0271433 A1 | 9/2017 | Wang et al. |

OTHER PUBLICATIONS

Office Action and Search Report dated Apr. 30, 2020 issued by the German Patent and Trade Mark Office for counterpart application No. 102018122563.6.

Office Action and Search Report dated May 12, 2020 issued by China National Intellectual Property Administration for counterpart application No. 201811106664.0.

\* cited by examiner

SEMICONDUCTOR DEVICE WITH INTEGRATED CAPACITOR AND MANUFACTURING METHOD THEREOF

PRIORITY CLAIM AND CROSS-REFERENCE

This application claims priority to U.S. patent application Ser. No. 62/566,000 filed 29 Sep. 2017, the disclosure of which is hereby incorporated by reference in its entirety.

BACKGROUND

In modern semiconductor devices and systems, integration and miniaturization of components have progressed at an increasingly rapid pace, in wireless applications, one of the growing challenges encountered by the integration process is the disposition of capacitors. Conventional capacitors associated with integrated circuits are usually designed with limited performance and capability due to the space constraints of the circuits. Thus, an improved integrated antenna structure is desired.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
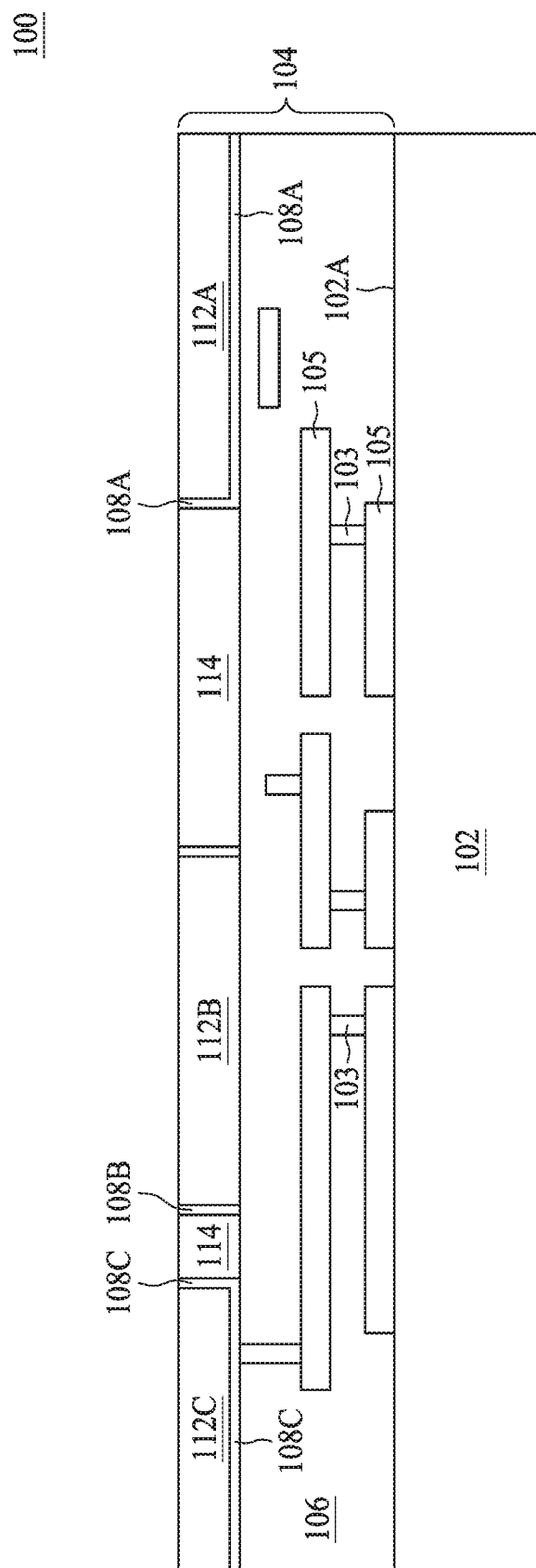
FIG. 1 to FIG. 7 are cross-sectional views of intermediate structures for a method of manufacturing a semiconductor device, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure provides a semiconductor structure with an integrated capacitor structure and its manufacturing method, according to various embodiments. As the semiconductor industry continues to develop advanced devices, the design and manufacturing of the capacitor presents a new challenge. That is because the capacitive performance of a capacitor is largely determined by the area occupied by the electrodes (or conductive plates) of the capacitor. However, such constraint must compete with the trend of reducing the footprint for the current advanced semiconductor devices. In the present disclosure, a capacitor structure is proposed in which the electrodes are formed in parallel along a horizontal direction with an insulating film disposed therebetween. In addition, one or more conductive vias are formed along vertical direction to conductively couple to the electrodes. The electrodes may extend beyond the conductive vias to gain a greater electrode area. The conductive vias may extend through the electrodes. Moreover, the electrodes and the conductive vias are formed such that the contact area between the electrodes and the conductive vias is increased. The capacitive performance of the capacitor structure may be maintained or enhanced while the contact resistance is reduced.

An improved manufacturing method for forming the proposed capacitor structure is also discussed. Through appropriate patterning schemes for forming the electrodes, the multiple different vias of the capacitor structure may be formed by a single etching operation. Multiple etching operations for forming different vias may be avoided. In addition, the remaining portion of the capacitor structure and the device can be protected from damage by limiting etching operations to the single etching operation. As a result, the manufacturing cost and time are reduced accordingly.

FIG. 1 to FIG. 5 are cross-sectional views of intermediate structures for a method of manufacturing a semiconductor device 100, in accordance with some embodiments. Referring to FIG. 1, a substrate 102 is received or provided. The substrate 102 (also referred to as a die substrate) includes a semiconductor material, such as silicon. In one embodiment, the substrate 102 may include other semiconductor materials, such as silicon germanium, silicon carbide, gallium arsenide, or the like. The substrate 102 may be a p-type semiconductive substrate (acceptor type) or an n-type semiconductive substrate (donor type). Alternatively, the substrate 102 may include another elementary semiconductor, such as germanium; a compound semiconductor including silicon carbide, gallium arsenic, gallium phosphide, indium phosphide, indium arsenide, or indium antimonide; an alloy semiconductor including SiGe, GaAsP, AlInAs, AlGaAs, GaInAs, GaInP, or GaInAsP; or combinations thereof. In another alternative, the substrate 102 may be a semiconductor-on-insulator (SOI). In still other alternatives, the substrate 102 may include a doped epitaxial layer, a gradient semiconductor layer, or a semiconductor layer overlaying another semiconductor layer of a different type, such as a silicon layer on a silicon germanium layer.

Various electrical components may be formed on a front surface (front side) 102A of the substrate 102. Examples of the electrical components include active devices, such as transistors and diodes, and passive devices, such as capacitors, inductors, and resistors. The electrical components may also include conductive features, such as conductive lines or conductive vias, and insulating features electrically insulating the conductive features. In some embodiments, the substrate 102 comprises one or more connection terminals (not shown) on the front surface 102A that are utilized to conductively couple the electrical components of the substrate 102 to external circuits or devices.

A redistribution layer (RDL) 104 is formed over the substrate 102. The RDL 104 is configured to electrically connect its overlying components. In addition, the RDL 104 is configured to electrically couple its overlying components with the electrical components of the substrate 102. The RDL 104 may include multiple metal layers (e.g., a single layer 107 or a portion 106 taken as a collection of metal layers of the RDL 104). Each of the metal layers may include conductive wires or lines and is electrically coupled to an adjacent overlaying or underlying metal layer through metal vias. For example, several spaced metal lines 105 are disposed in the portion 106 and are interconnected through corresponding metal vias 103. Moreover, the metal lines 105 and metal vias 103 are electrically insulated from other components. The insulation may be achieved by insulating materials, such as an inter-metal dielectric (IMD). The forming of the RDL 104 is elaborated in the following description with the sublayer 107 as an example.

When the portion 106 is completed, an IMD 114 is deposited on the underlying portion 106. The dielectric material of the IMD 114 may be formed of oxides, such as un-doped silicate glass (USG), fluorinated silicate glass (FSG), low-k dielectric materials, or the like. The low-k dielectric materials may have dielectric constants (i.e., k values) lower than 3.8, although the dielectric materials of the IMD 114 may be close to 3.8. In some embodiments, the k values of the low-k dielectric materials are lower than about 3.0, and may be lower than about 2.5. In accordance with some embodiments, the dielectric layer comprises a polymer material. In an embodiment, the IMD may be formed with a variety of dielectric materials including, for example, oxide (e.g., Ge oxide), nitride, oxynitride (e.g., GaP oxynitride), silicon dioxide ($SiO_2$), a nitrogen-bearing oxide (e.g., nitrogen-bearing $SiO_2$), a nitrogen-doped oxide (e.g., $N_2$-implanted $SiO_2$), silicon oxynitride ($Si_xO_yN_z$), a polymer material, or the like. The IMD 114 may be formed by initially forming a blanket dielectric material through a suitable process, such as chemical vapor deposition (CVD), physical vapor deposition (PVD), atomic layer deposition (ALD), spin-on coating, or the like. Next, a photoresist (not separately shown) is formed over the blanket material. Patterning operations, such as lithographic and etching methods, are performed on the photoresist layer to form recesses.

Subsequently, a conductive material is deposited into the recesses to form conductive lines 112A, 112B and 112C. Materials of the conductive lines 112A, 112B and 112C include, for example, titanium, tantalum, titanium nitride, tantalum nitride, copper, copper alloys, nickel, tin, gold, and combinations thereof. In some embodiments, the conductive lines 112A, 112B and 112C comprise a layered structure with different conductive sublayers. For example, seed layers (or glue layers) 108A, 108B or 108C are initially formed on the bottoms and sidewalls of the respective recesses prior to the deposition of the conductive material 112A, 112B and 112C. The seed layers 108A, 108B and 108C may be formed by a conductive material, such as titanium, titanium nitride or the like. The conductive lines 112A, 112B, 112C or the seed layers 108A, 108B and 108C may be formed using the CVD, PVD, ALD, electroplating, sputtering, or the like.

In an embodiment, the RDL 104 may include more layers over the layer 107. In most circuit designs, a layer in a lower portion of the RDL 104 that is closer to the substrate 102 (such as the portion 106) may have a greater line density than another layer in a higher portion of the RDL 104 (such as layers over the layer 107). When incorporated into the RDL 104, a capacitor structure may be formed in a higher portion of the RDL 104 such that a larger space between conductive lines can be allocated. FIG. 2 to FIG. 10 illustrate the formation of a capacitor structure in the RDL 104 above the layer 107.

Figure 2:
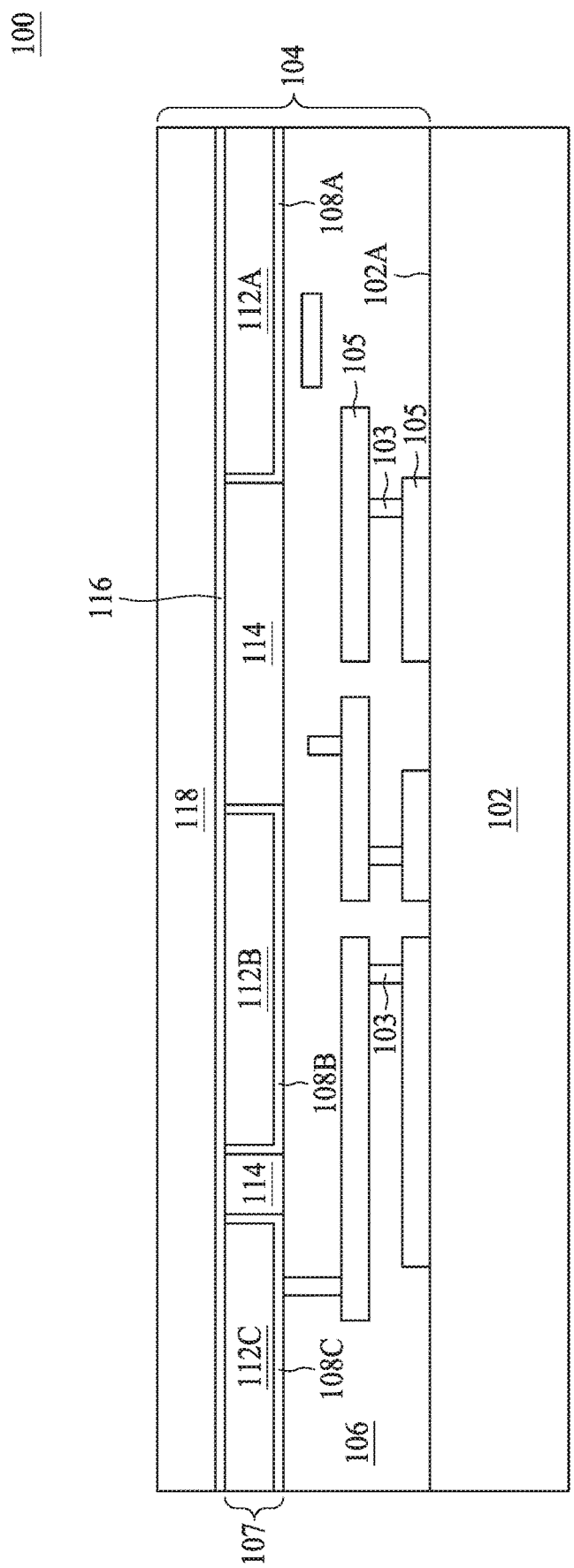

Referring to FIG. 2, a first protection layer 116 and a second protection layer 118 are formed over the layer 107. In some embodiments, the first protection layer 116 and the second protection layer 118 may be formed with a variety of dielectric materials and may, for example, be oxide (e.g., Ge oxide), nitride, oxynitride (e.g., GaP oxynitride), silicon dioxide ($SiO_2$), a nitrogen-bearing oxide (e.g., nitrogen-bearing $SiO_2$), a nitrogen-doped oxide (e.g., $N_2$-implanted $SiO_2$), silicon oxynitride ($Si_xO_yN_z$), a polymer material, or the like. In an alternative embodiment, the first protection layer 116 and the second protection layer 118 include a polymeric material such as polyimide (PI), polybenzoxazole (PBO), benzocyclobuten (BCB), epoxy, or the like. In the depicted example, the first protection layer 116 is formed of silicon nitride, and the second protection layer 118 is formed of USG. The first protection layer 116 and the second protection layer 118 may be formed using a CVD, PVD, spin-on coating, or other suitable operation. In an embodiment, the first protection layer 116 has a thickness between 700 Angstrom and 800 Angstrom, far example 750 Angstrom. In an embodiment, the second protection layer 118 has a thickness between 1000 Angstrom and 5000 Angstrom, for example 3000 Angstrom.

Figure 3:
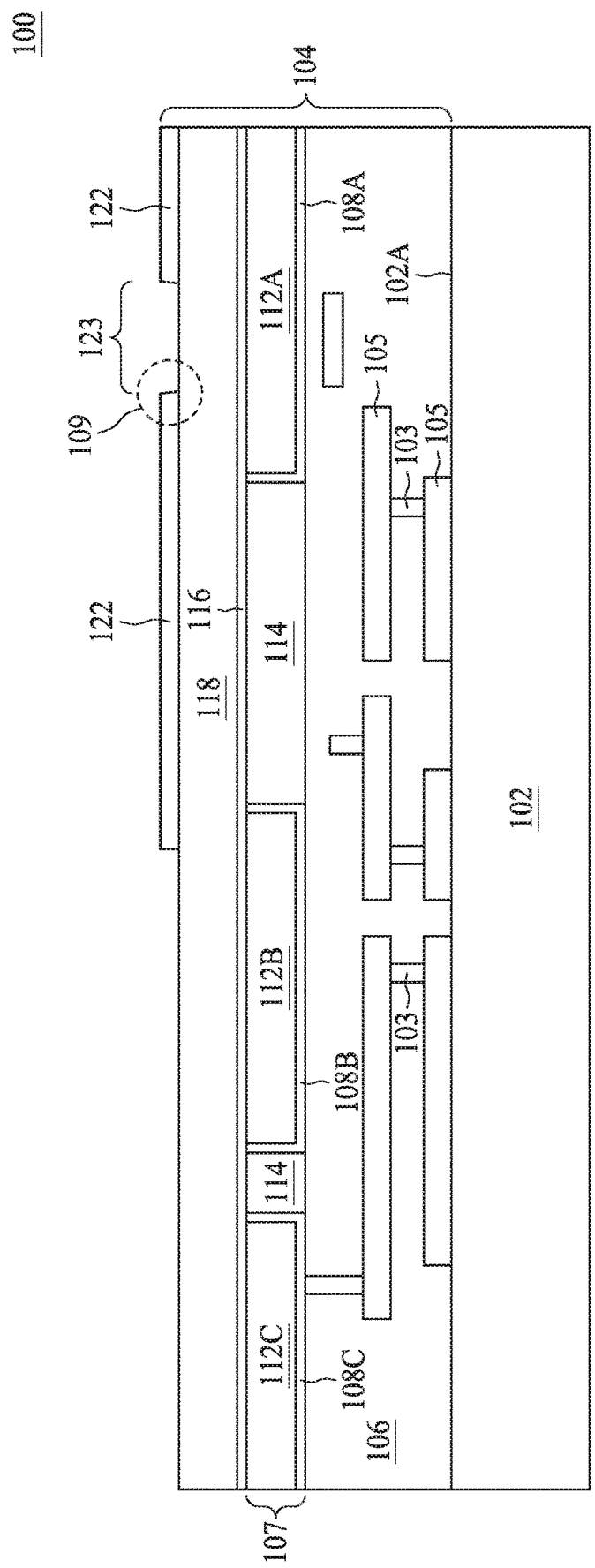

Next, a patterned first conductive layer 122 is formed over the second protection layer 118, as illustrated in FIG. 3. In an embodiment, the first conductive layer 122 serves as an electrode or conductive plate (such as conductive layers 122 and 132, which are discussed below) of a capacitor structure. In some embodiments, the first conductive layer 122 has a shape like a plate, a sheet, or a strip. The first conductive layer 122 may be comprised of copper, silver, aluminum, gold, tungsten, titanium, titanium nitride, tantalum, tantalum nitride or combinations thereof. The first conductive layer 122 may be formed by initially depositing a conductive material over the second protection layer 118. A patterning operation is performed to shape the first conductive layer 122. During the patterning operation, a recess 123 is formed which exposes a portion of the second protection layer 118 corresponding to the conductive line 112A. In some embodiments, the thickness of the first conductive layer 122 is between about 200 Angstrom and about 500 Angstrom, for example 400 Angstrom. In some embodiments, the sidewall of the first conductive layer 132 at the recess 123 (indicated by the circle 109) may be formed as a right angle or have a slope.

Figure 4:
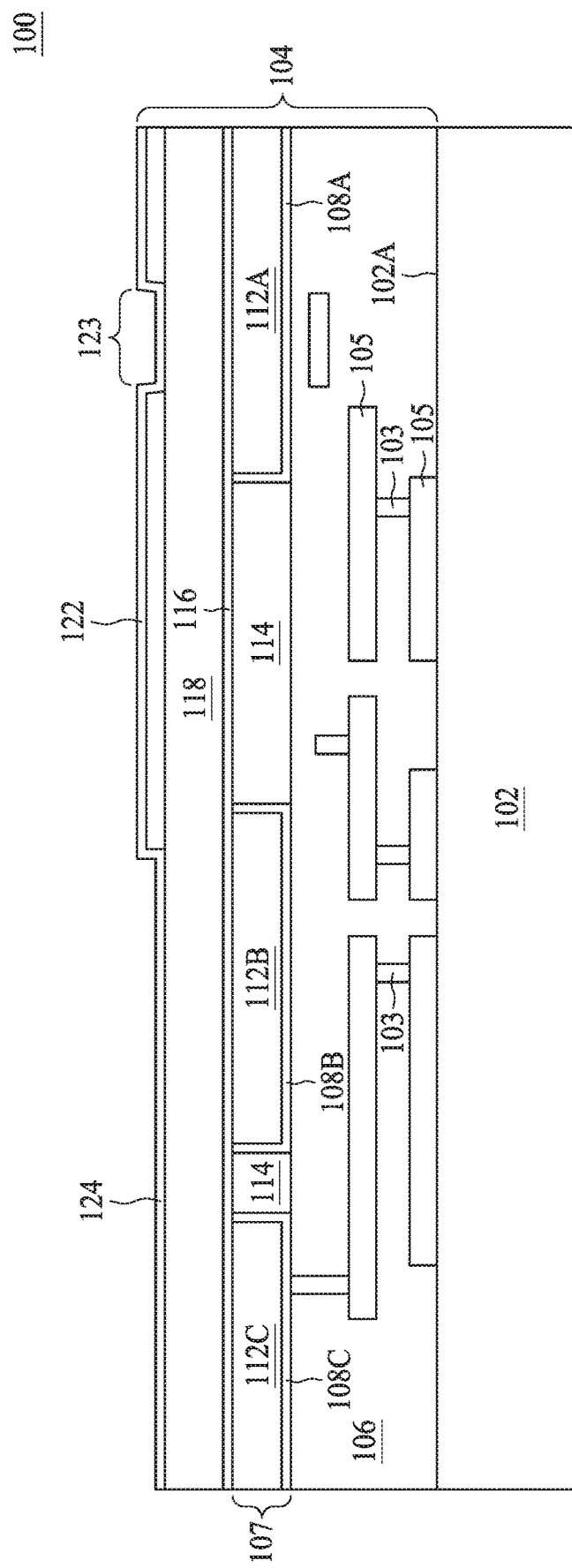

FIG. 4 shows the formation of a first insulating film 124. The first insulating film 124 serves as an electrical insulating material between a pair of electrodes of a capacitor structure. Generally, a greater dielectric constant of the first insulating film 124 corresponds to less thickness required of the first insulating film 124. In some embodiments, the thickness of the first insulating film 124 is between about 30 Angstrom and about 100 Angstrom, for example 60 Angstrom. In an embodiment, the first insulating film 124 covers the second protection layer 118 and the conductive layer 112. In an embodiment, the first insulating film 124 covers sidewalls of the first conductive layer 122. The first insulating film 124 may be also lined in the recess 123.

The first insulating film 124 may be formed of a dielectric material, such as silicon oxide, silicon nitride, silicon oxynitride, metal oxides, metal nitride, metal silicates, transition metal oxide, transition metal nitride, transition metal silicates oxynitrides of metal, metal aluminate, zirconium silicate, zirconium aluminate, or the like. In some embodiments, the first insulating film 124 may be formed of a high-k dielectric material. In some embodiments, the first insulating film 124 may be formed of $Al_2O_3$, $HfO_2$, $ZrO_2$, $HfO_xN_y$, $ZrO_xN_y$, $HfSi_xO_y$, $ZrSi_xO_y$, $HfSi_xO_yN_z$, $ZrSi_xO_yN_z$, $TiO_2$, $Ta_2O_5$, $La_2O_3$, $CeO_2$, $Bi_4Si_2O_{12}$, $WO_3$, $Y_2O_3$, $LaAlO_3$, $Ba_{1-x}Sr_xTiO_3$, $PbTiO_3$, $BaTiO_3$ (BTO), $SrTiO_3$ (STO), $BaSrTiO_3$ (BST), $PbZrO_3$, lead-strontium-titanate (PST), lead-zinc-niobate (PZN), lead-zirconate-titanate (PZT), lead-magnesium-niobium (PMN), yttria-stabilized zirconia (YSZ), ZnO/Ag/ZnO (ZAZ), a combination thereof, or the like. In the present embodiment, the first insulating film 124 includes ZAZ, which possesses a dielectric constant greater than a dielectric constant of the IMD 114, the first protection layer 116 or the second protection layer 118. The first insulating film 124 may be formed using CVD, PVD, ALD, or other suitable deposition operations.

Figure 5:
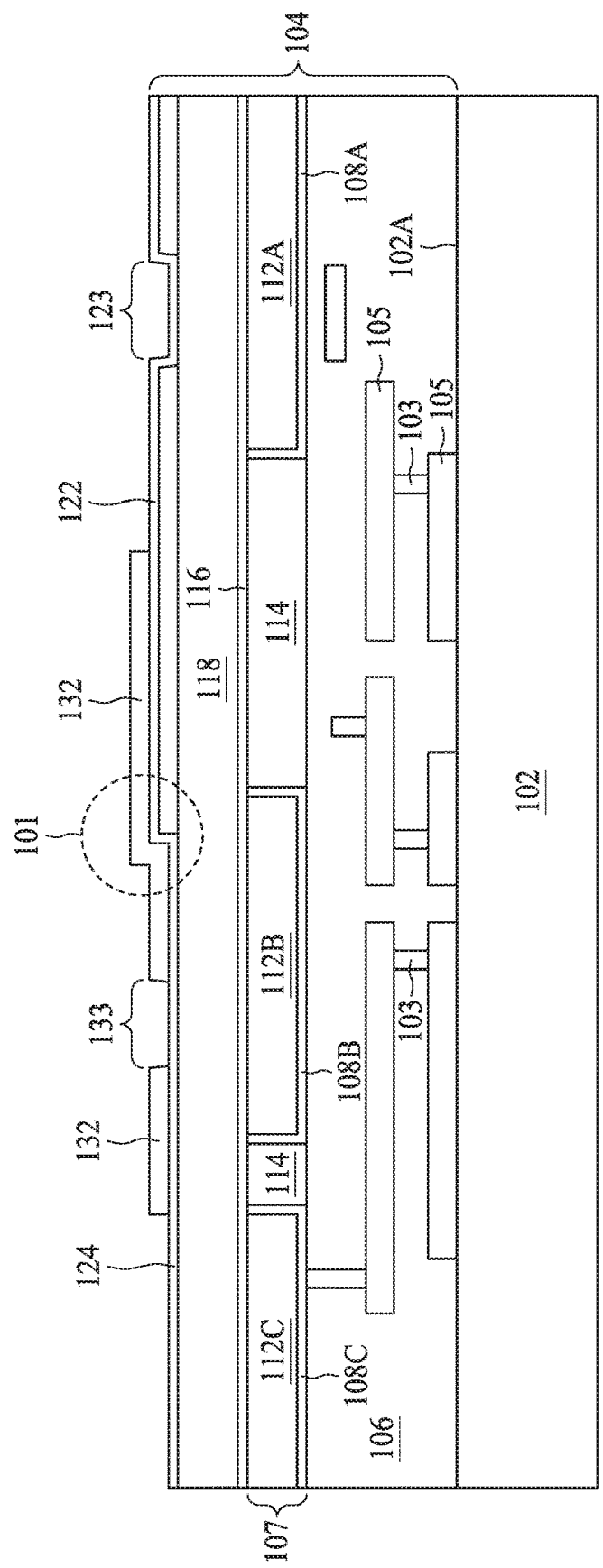

Next, a patterned second conductive layer 132 is formed over the first insulating film 124 and the first conductive layer 122, as illustrated in FIG. 5. In an embodiment, the second conductive layer 132 serves a second electrode or conductive plate of the capacitor structure. In some embodiments, the second conductive layer 132 has a shape like a plate, a sheet, or a strip. The second conductive layer 132 may be comprised of copper, silver, aluminum, gold, tungsten, titanium, titanium nitride, tantalum, tantalum nitride or combinations thereof. In some embodiments, the thickness of the second conductive layer 132 is between about 200 Angstrom and about 500 Angstrom, for example 400 Angstrom. The forming method of the second conductive layer 132 may be similar to that of the first conductive layer 122. During a patterning operation of the second conductive layer 132, a recess 133 is formed which exposes a portion of the first insulating film 124 corresponding to the conductive line 112B. In some embodiments, a portion of the first insulating film 124 is exposed through the patterned second conductive layer 132, for example, at locations around the recesses 123 and 133. In some embodiments, the second conductive layer 132 covers the first conductive layer 122 in a conformal manner while exposing a portion of the first insulating film 124 through the recess 133. When viewed from a cross-sectional perspective, the second conductive layer 132 extends from a first end portion over the first conductive layer 122 towards a second end portion adjacent to the conductive line 112O. A step/corner 101 is formed in the second conductive layer 132. The corner 101 may have a substantially right angle or a slope.

Figure 6:
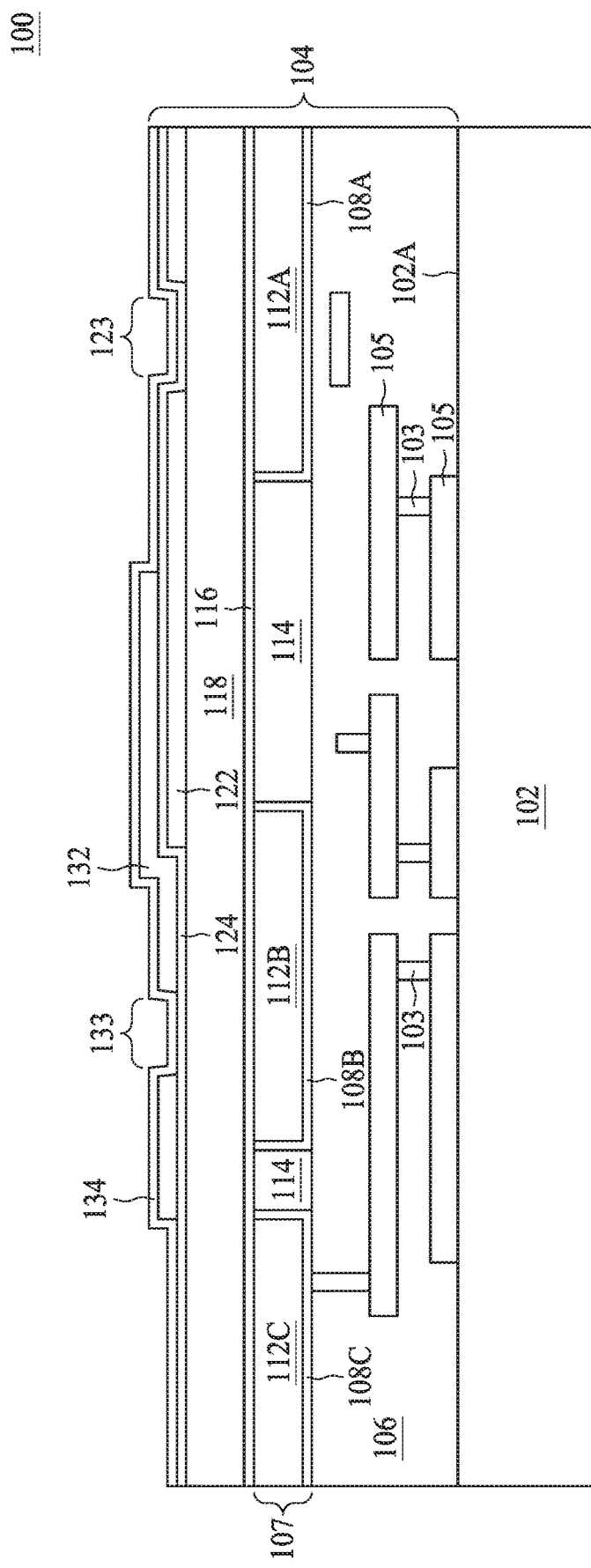

Subsequent to the operation shown in FIG. 5, a second insulating film 134 is formed as demonstrated in FIG. 6. The second insulating film 134 serves as an electrical insulating material between another pair of electrodes (such as conductive layers 132 and 134 which are discussed below) of the capacitor structure in the present disclosure. The manufacturing method and materials of the second insulating film 134 may be similar to those of the first insulating film 124.

In some embodiments, the thickness of the second insulating film 134 is between about 30 Angstrom and about 100 Angstrom, for example 60 Angstrom. In an embodiment, the second insulating film 134 covers the conductive layers 122 and 132, and the first insulating film 124. In an embodiment, the second insulating film 134 covers sidewalls of the second conductive layer 132. In some embodiments, the second insulating film 134 covers at least a portion of the sidewall of the first conductive layer 122 at the recess 123. If the insulating films 124 and 134 have substantially equal deposition thicknesses, the thickness of the insulating material at the bottom of the recess 123 or 133 is doubled after the second insulating film 134 is formed over the first insulating film 124.

Figure 7:
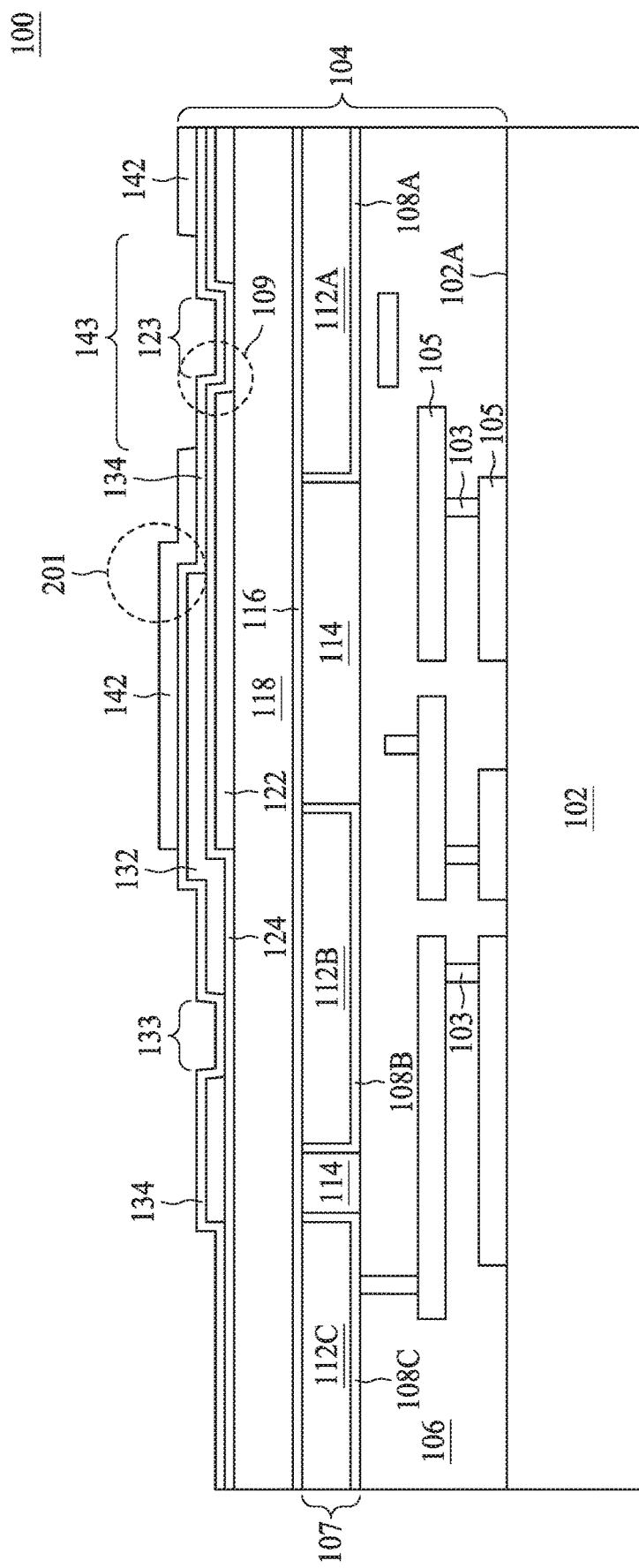

Next, a patterned third conductive layer 142 is formed over the second insulating film 134 and the second conductive layer 132, as illustrated in FIG. 7. In an embodiment, the third conductive layer 142 serves as yet another electrode of the capacitor structure. In an embodiment, the third conductive layer 142 may be conductively coupled to the first conductive layer 122 such that both conductive layers effectively serve as a single electrode of the capacitor structure. In some embodiments, the third conductive layer 142 has a shape like a plate, a sheet, or a strip. The third conductive layer 142 may be comprised of copper, silver, aluminum, gold, tungsten, titanium, titanium nitride, tantalum, tantalum nitride or combinations thereof. In some embodiments, the thickness of the third conductive layer 142 is between about 200 Angstrom and about 500 Angstrom, for example 400 Angstrom.

The forming method of the third conductive layer 142 may be similar to the forming method of the conductive layer 122 or 132. During a patterning operation of the third conductive layer 142, a recess 143 is formed which exposes a portion of the second insulating film 134 overlaying the recess 123. In some embodiments, the recess 143 has a greater area from a top view than the area of the recess 123. In some embodiments, the recess 143 has a greater width from a cross-sectional view than the width of the recess 123. In some embodiments, a portion of the second insulating film 134 is exposed through the patterned third conductive layer 142, for example, at locations over the conductive lines 112B and 112C. In some embodiments, the first conductive layer 122 has an end portion extending beyond an end portion of the third conductive layer 142 at the recess 143. A portion of the second insulating film 134 that covers the first conductive layer 122 is exposed through the third conductive layer 142 and serves as a portion of the bottom of the recess 143. In some embodiments, the third conductive layer 142 partially covers the second conductive layer 132 in a conformal manner and extends from a first end portion directly over the second conductive layer 132 towards a second end portion over the conductive line 112A. A step/corner 201 is formed in the third conductive layer 142. The corner 201 may have a substantially right angle or a slope.

Figure 7A:
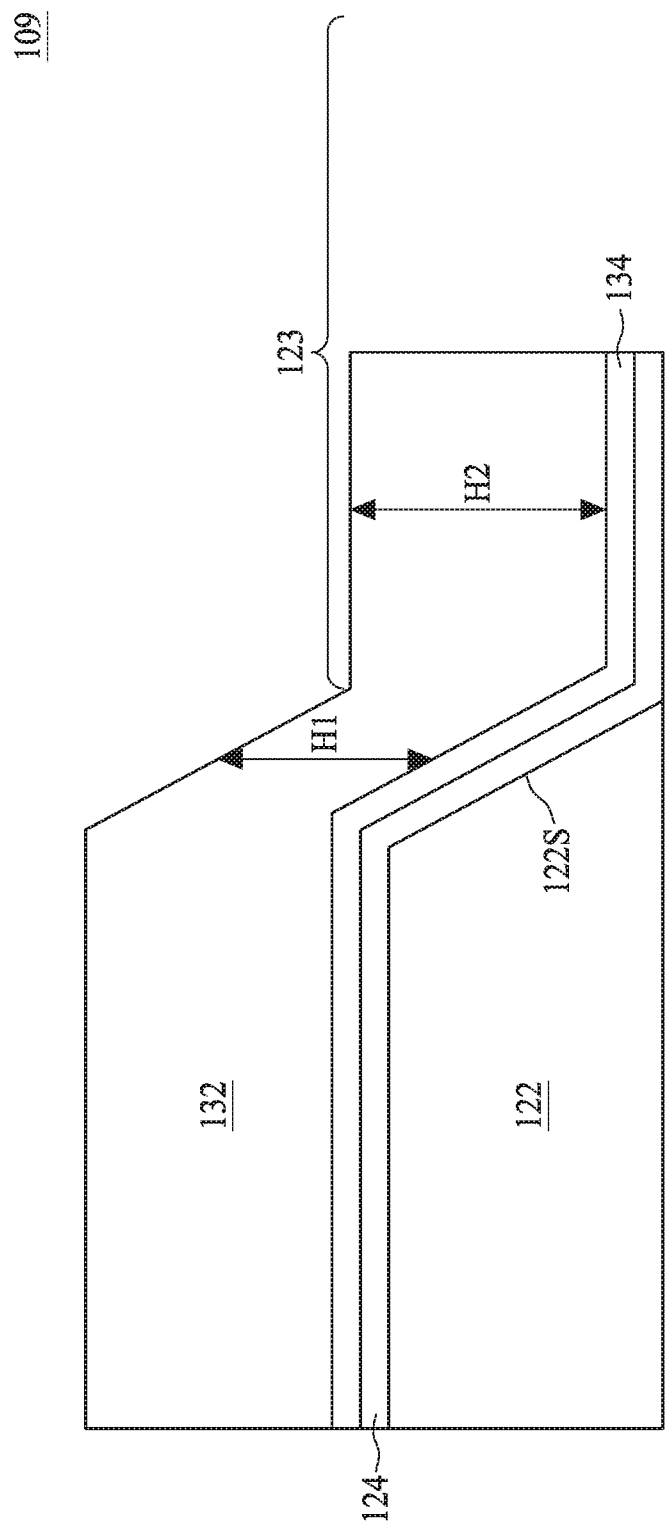
FIG. 7A is an enlarged view of the cross-sectional view of an intermediate stage of manufacturing a semiconductor device, in accordance with some embodiments.

FIG. 7A is an enlarged view of the cross-sectional view of the corner 109 in FIG. 7 during an intermediate stage of forming the third conductive layer 142, in accordance with some embodiments. FIG. 7A illustrates a manufacturing stage in which the third conductive layer 142 is formed over the first insulating film 124 and the second insulating film 134 through a blanket deposition while not being patterned. Since the first conductive layer 122 has an angled sidewall 122S facing the recess 123, the deposited third conductive layer 142 follows the sloped configuration at portions above the sidewall 122S. Through the patterning operation, portions of the third conductive layer 142 around the recess 123 are removed, thereby forming the patterned third conductive layer 142 shown in FIG. 7. The deposition thickness of the third conductive layer 142 over the sidewall 122S is closely related to the angle of the slope at the sidewall 122S. Without a sufficient angle of the sidewall 122S (e.g., the sidewall 122S may exhibit a substantially right angle), a thickness H1 of the third conductive layer 142 right above the sidewall 122S of the first conductive layer 122 may be much greater than the thickness H2 formed at a horizontal portion. When an etching operation is employed to pattern the third conductive layer 142, a thickness of the third conductive layer 142 is removed from the portions around the recess 123. In an embodiment, a dry etch is used for performing the patterning operation. As a result, since thickness H1 is made close to thickness H2 due to the angled sidewall 122S, a uniform removal of the conductive materials can be achieved across thicknesses H1 and H2 through the etching operation. There would be few or substantially free of residues of conductive materials of the third conductive layer 142 remaining on the angled sidewall right above the sidewall 122S. A better profile control of the third conductive layer 142 can be obtained. In an embodiment, the second conductive layer 132 has an angled sidewall around the recess 133 (not separately shown) in a configuration similar to the sidewall 122S.

Figure 8:
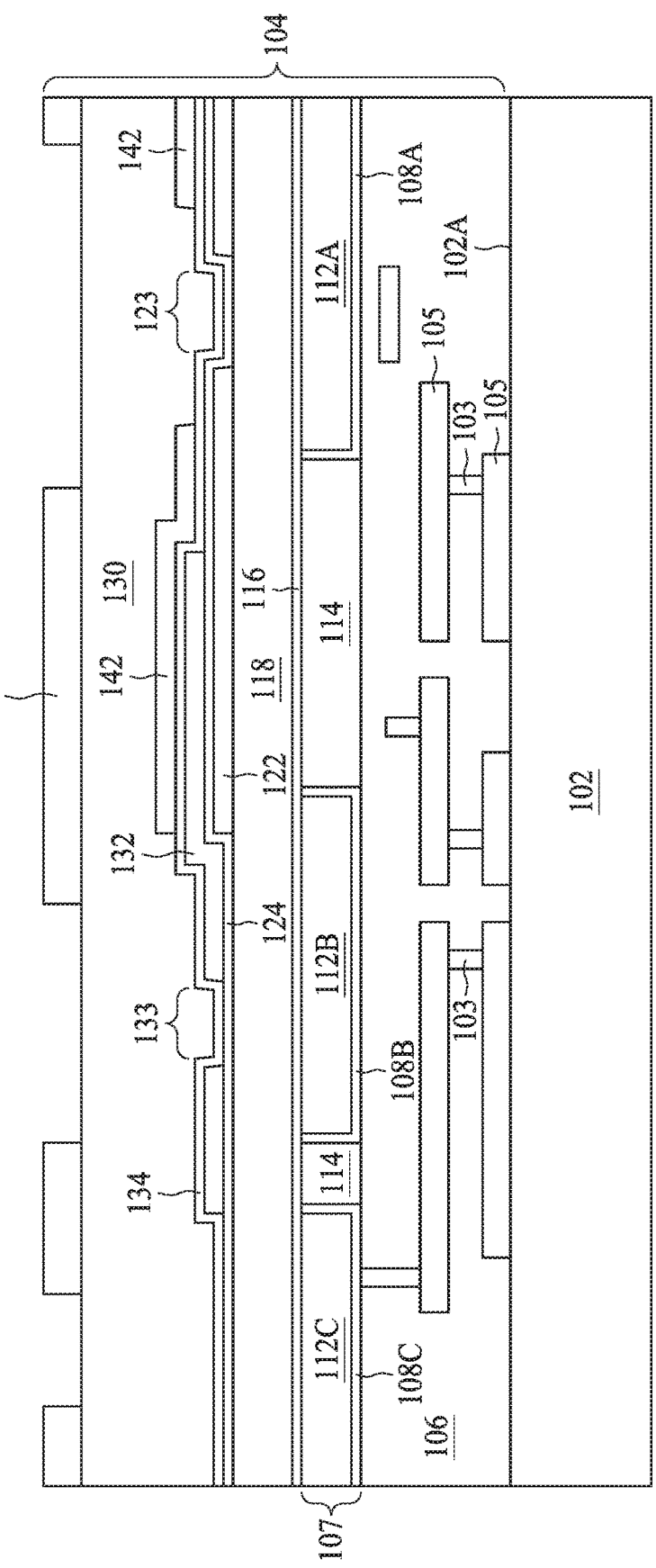
FIG. 8 to FIG. 10 are cross-sectional views of intermediate structures for a method of manufacturing a semiconductor device, in accordance with some embodiments.

Referring to FIG. 8, subsequent to the operation in FIG. 7, an IMD 130 is deposited over the second insulating film 134 and the third conductive layer 142. The IMD 130 may comprise a dielectric material such as oxide, nitride, oxynitride, silicon dioxide, nitrogen-bearing oxide, nitrogen-doped oxide, silicon oxynitride ($Si_xO_yN_z$), polymer, or the like. In an embodiment, the IMD 130 has a thickness between about 5000 Angstrom and 6000 Angstrom, for example 5500 Angstrom. The material and manufacturing method of the IMD 130 may be similar to those of the IMD 114. In an embodiment, a planarization operation, such as grinding or chemical mechanical planarization (CMP) operation may be employed to planarize the IMD 130 and remove excess material of the IMD 130.

Subsequently, a mask layer 138 is formed over the IMD 130. The mask layer may be formed of a photoresist material or a dielectric material, such as nitride. A masking material is initially deposited over the IMD 130. Next, a patterning operation is performed on the masking material to form the mask layer 138 with openings that define the geometries of conductive vias that are to be formed in the IMD 130. In some embodiments, the openings correspond to the conductive lines 112A, 112B and 112C.

Figure 9:
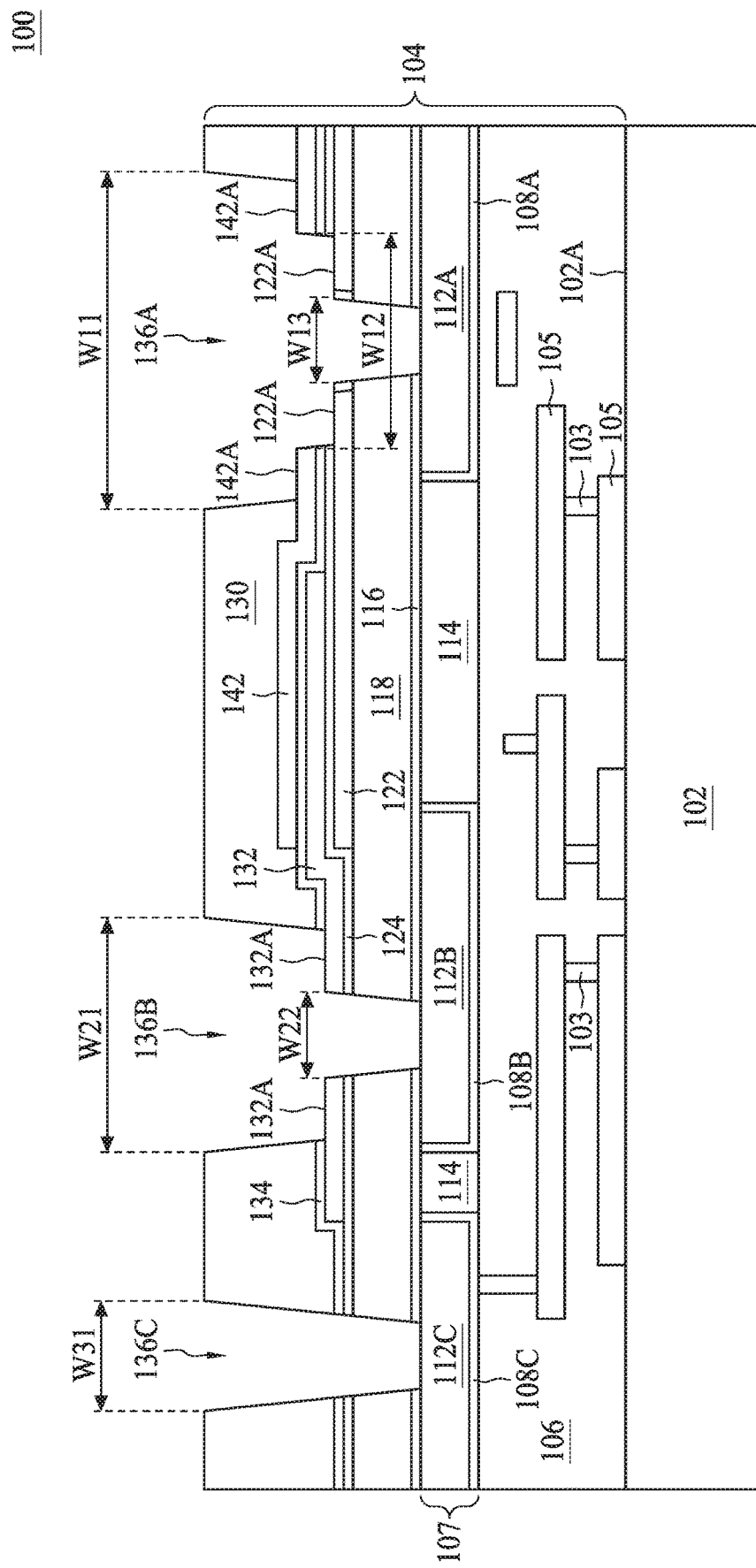

FIG. 9 shows a formation of vias 136A, 136B and 136C in the IMD 130. The vias 136A, 136B and 136C may be formed by an etching operation, such as a dry etch, a wet etch or a combination thereof. In the present embodiment, the vias 136A, 136B and 136C are formed during a single dry etching operation. In some embodiments, the mask layer 138 is removed or etched after the vias 136A, 136B and 136C are completed. The vias 136A, 136B and 136C extend through the IMD 130, the insulating films 124 and 134, and the protection layers 116 and 118. The vias 136A, 136B and 136C expose upper surfaces of the respective conductive lines 112A, 112B and 112C.

The via 136A extends through the recesses 143 and 123. In some embodiments, the via 136A has a stepped shape. In some embodiments, the via 136A has progressively contracting steps starting from its upper end towards its bottom end contacting the conductive line 112A. For example, a width W11 of the via 136A at the level of IMD 130 is greater than a width W12 of the via 136A at the recess 143 at the level of the third conductive layer 142. As a result, a portion of an upper surface 142A of the third conductive layer 142 is exposed. In an embodiment, the upper surface 142A has an exposed width W11-W12 of between about 100 Angstrom and about 400 Angstrom from a cross-sectional view. Moreover, the width W12 of the via 136A at the level of the recess 143 is greater than a width W13 of the via 136A at the level of the recess 123, i.e., at the level of the first conductive layer 122. As a result, a portion of an upper surface 122A of the first conductive layer 122 is exposed. In an embodiment, the upper surface 122A has an exposed width W12-W13 of between about 100 Angstrom and about 400 Angstrom from a cross-sectional view.

Similarly, the via 136B extends through the recesses 133. In some embodiments, the via 136B has a stepped shape. In some embodiments, the via 136B has progressively contracting steps starting from its upper end towards its bottom end contacting the conductive line 112B. For example, a width W21 of the via 136B at the level of the IMD 130 is greater than a width W22 of the via 136B at the level of the recess 133, i.e., at the level of the second conductive layer 132. As a result, a portion of an upper surface 132A of the second conductive layer 132 is exposed. In an embodiment, the upper surface 132A has an exposed width W21-W22 of between about 100 Angstrom and about 400 Angstrom from a cross-sectional view.

The via 136C is formed to contact the conductive line 112C. In some embodiments, the via 136C serves as a conductive via of the RDL 104 and does not contact any of the conductive layers 122, 132 and 142 of the capacitor structure. The via 136C may not possess a shape other than a stepped shape like the vias 136A and 136B.

In some embodiments, some of the conductive layers 122, 132 and 142 may have a sloped sidewall such that the etching operation may completely remove the insulating materials on the sidewalls. In alternative embodiments, some insulating material remains on the sidewalls of the conductive layers 122, 132 and 142. As an exemplary configuration, the via 136A exposes sidewalls of the third conductive layer 142 from a cross-sectional view at the recess 143. Similarly, the via 136B exposes sidewalls of the second conductive layer 132 from a cross-sectional view at the recess 133. In some embodiments, a portion of the first insulating film 124 remains to cover the sidewalls of the first conductive layer 122 at the recess 123.

Referring to FIG. 8 and FIG. 9, the vias 136A, 136B and 136C extend through different numbers of conductive layers (e.g., the via 136A extends through conductive layers 122 and 142, while the via 136B extends through the second conductive layer 132 and the via 136C does not extend through any of the conductive layers). However, the formed recesses 123, 133 and 143 allow the etching operation to etch through substantially a same combination of dielectric layers, i.e., the first protection layer 116, the second protection layer 118, the insulating films 124 and 134, and the IMD 130. No conductive layers are taken into consideration during the etching operation, and thus the adopted etch recipes and attained etch performances for the different vias 136A, 136B and 136C are similar. As a result, a single etching operation, such as a dry etch, is sufficient for the three different vias 136A, 136B and 136C, which provides a saving of the manufacturing cost and time.

Figure 10:
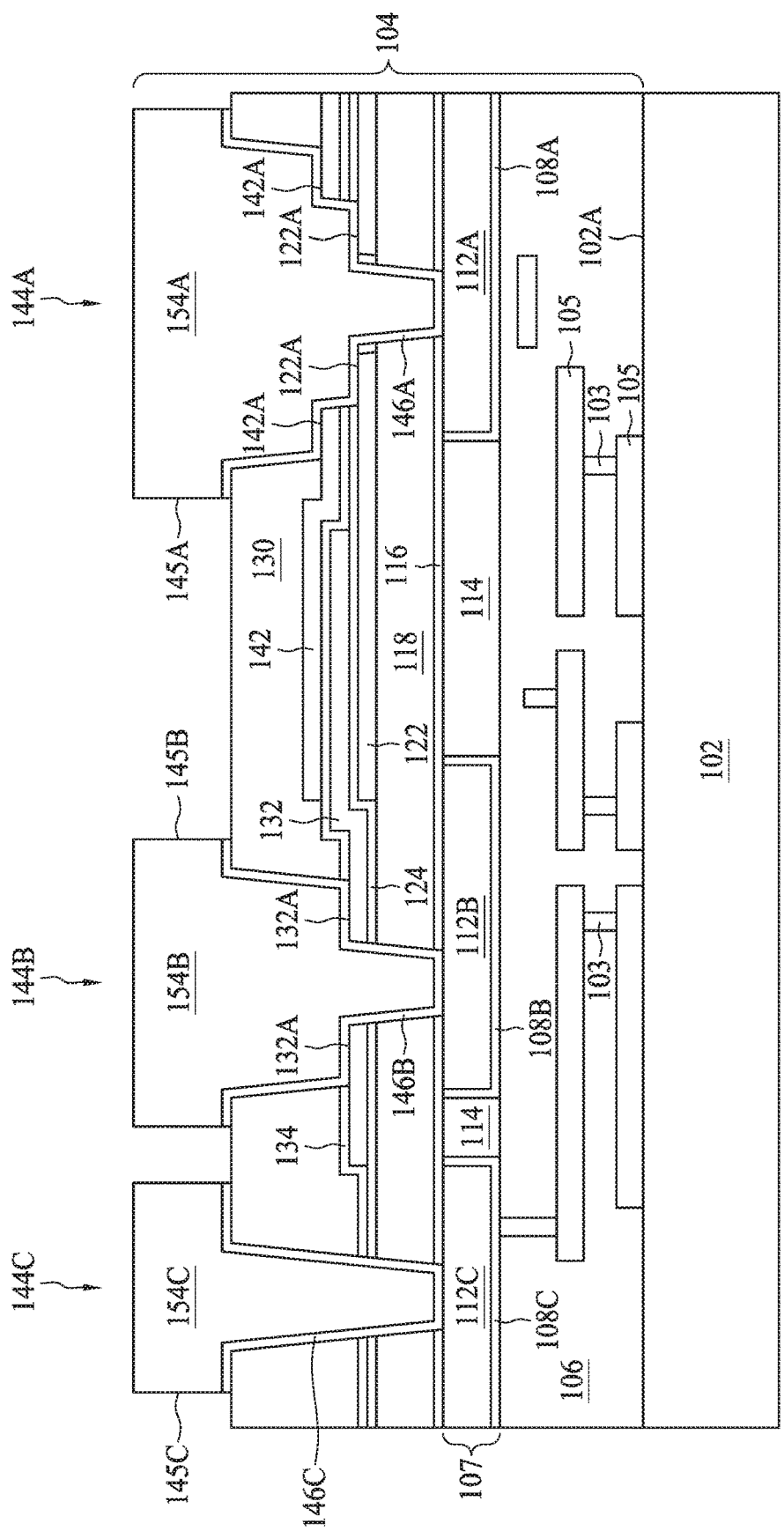

FIG. 10 illustrates a formation of the conductive structures 144A, 144B and 144C in the vias 136A, 136B and 136C, respectively. The conductive structures 144A, 144B and 144C can be seen as conductive vias. Materials of the conductive structures 144A, 144B and 144C include, for example, titanium, tantalum, titanium nitride, tantalum nitride, copper, copper alloys, nickel, tin, gold, and combinations thereof. In some embodiments, the conductive structures 144A, 144B and 144C comprise a layered structure with different conductive sublayers. For example, seed layers (or glue layers) 146A, 146B and 146C, are initially lined on the bottoms and sidewalls of the respective recesses prior to the deposition of the conductive filling material 154A, 154B and 154C. The seed layers 146A, 146B and 146C may be formed by a conductive material, such as titanium, titanium nitride or the like. The conductive filling materials 154A, 154B and 154C or the seed layers 146A, 146B and 146C may be formed using CVD, PVD, ALD, electroplating, sputtering, or the like. The first conductive layer 122 and the third conductive layer 142 are conductively coupled to each other through the conductive structure 144A and electrically insulated from the second conductive layer 132; thus they can be regarded as a joint electrode of the capacitor structure. The second conductive layer 132 is conductively coupled to the conductive structure 144B and is regarded as another electrode of the capacitor structure.

The conductive structure 144C is conductively coupled to the conductive line 112C. The conductive route comprised of the conductive structure 144C and conductive line 112C may be used for a logic device other than the capacitor structure. In an embodiment, the conductive structure 144C is formed during an operation that includes forming the conductive structures 144A and 144B.

Referring to FIG. 10, the conductive structure 144A, 144B or 144C exhibits a stepped shape that is conformal to sidewalls of the conductive layers 122, 132 and 142 from a cross-sectional view. In an embodiment, the conductive structure 144A, 144B or 144C has a stepped shape following the stepped configuration formed of the conductive layers 122, 132, and 142 and insulating films 134 and 144. The stepped shape of the conductive structure 144A enables the third conductive layer 142 to contact the conductive structure 144A through a planar surface (e.g., the upper surface 142A) in addition to the sidewall of the third conductive layer 142. A greater contact area is achieved and the contact resistance is reduced. Similarly, the first conductive layer 122 conductively couples to the conductive structure 144A through a planar surface, e.g., the upper surface 122A. Since the contact area of the upper surface 122A is significantly greater than that of the sidewall of the first conductive layer 122, the adverse impact of the first insulating film 124 covering the sidewall of the first conductive layer 122 can be minimized. Moreover, the stepped shape of the conductive structure 144B enables the second conductive layer 132 to contact the conductive structure 144B through a planar surface (e.g., the upper surface 132A) in addition to the sidewall of the second conductive layer 132.

In the present embodiment, the conductive structure 144A runs through the first conductive layer 122 and the third conductive layer 142 to conductively couple them with the underlying conductive line 112A. In other words, the third conductive layer 142 is conductively coupled to the remaining circuits of RDL 104 through the conductive line 112A. Such configuration is useful when the capacitor electrode (e.g., third conductive layer 142) is formed at a higher portion of the RDL 104 in order to have a greater electrode area among the sparsely deployed interconnected circuits. However, since the interconnected circuits above the conductive layer 142 are sparsely configured, it may not be efficient to provide electrical connections for the third conductive layer 142 through portions thereabove. Consequently, a run-through configuration of the conductive structure 144A may enhance the electrical performance of the capacitor electrode.

The conductive structures 144A, 144B and 144C include horizontal portions 145A, 145B and 145C, respectively, extending over the IMD 130. The horizontal portions 145A, 145B and 145C may have a circular shape or a polygonal shape from a top view. In some embodiment, the horizontal portions 145A, 145B and 145C serve as contact pads or input/output pads of the semiconductor device 100 for conductively coupling with other devices. In an embodiment, the horizontal portions 145A, 145B and 145C are in a topmost layer of the semiconductor device 100.

Figure 11:
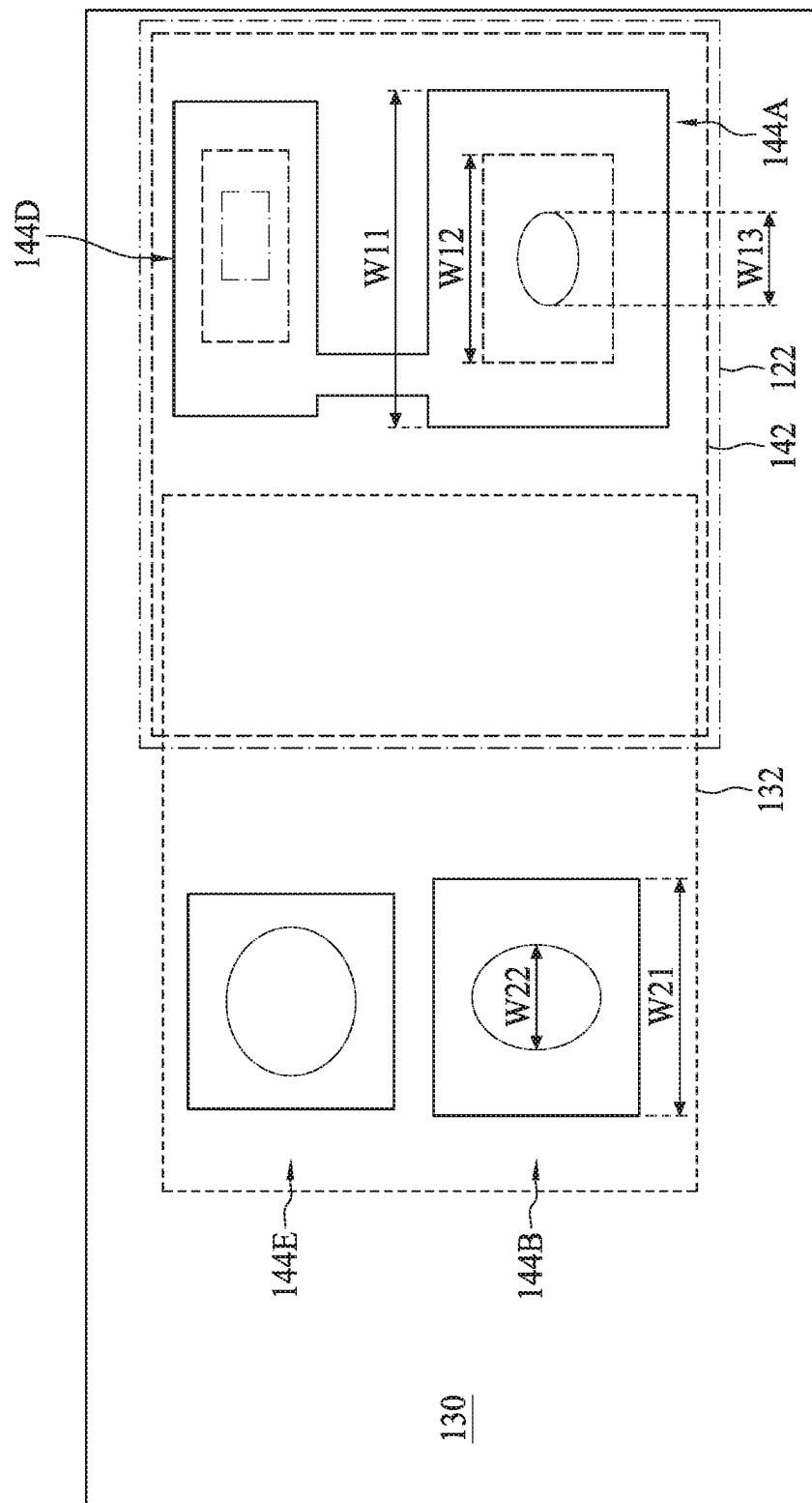
FIG. 11 is a schematic top view of the semiconductor device in FIG. 10, in accordance with some embodiments.

FIG. 11 is a schematic top view of the semiconductor device 100 in FIG. 10, in accordance with some embodiments. FIG. 11 merely illustrates top views of some features in FIG. 10, such as the conductive layers 122, 132 and 142, and the conductive structures 144A and 144B, for simplicity and clarity. The second conductive layer 132 partially overlaps the conductive layers 122 and 142. The conductive structure 144A or 144B has a stepped shape, and each step in FIG. 10 is illustrated with different line types along with its dimensions. As mentioned previously, the stepped configurations of the conductive structures 144A and 144B enable the contact of the conductive structure 144A or 144B with the corresponding conductive layers 142, 122 and 132 from their upper surfaces 142A, 122A and 132A. Each step may have different shapes from a top view, such as a circular shape, a rectangular shape, or a polygonal shape. The area of the via 136A at the level of IMD 130 (corresponding to the width W11) is greater than the area of the via 136A at the recess 143 at the level of the third conductive layer 142 (corresponding to the width W12). Similarly, the area of the via 136A at the level of the third conductive layer is greater than the area of the via 136A at the recess 123 or the first conductive layer 122 (corresponding to the width W13). In addition, the area of the via 136B at the level of IMD 130 (corresponding to the width W21) is greater than the area of the via 136B at the recess 133 or the level of the second conductive layer 132 (corresponding to the width W22).

FIG. 11 also demonstrates an additional conductive structure 144D, which is formed to conductively couple to the conductive layers 142 and 122 in a manner similar to that of the conductive structure 144A. A via may be formed adjacent to the via 136A during the formation of the via 136A, followed by deposition of a conductive material into such via to form the conductive structure 144D. In addition, a conductive structure 144E is formed to conductively couple to the second conductive layer 132 in a manner similar to that of the conductive structure 144B. In an embodiment, the conductive structures 144A and 144D are conductively coupled via a conductive line or strip to form a merged conductive structure. The proposed multiple conductive via configurations may allow for a greater capacitor electrode area extending in a horizontal direction to accommodate additional conductive structures. Moreover, through disposition of additional conductive vias e.g., conductive structure 144D or 144E) that conductively couple to the conductive layers, an effective contact resistance between the capacitor structure and the semiconductor device 100 is further reduced.

FIG. 12 to FIG. 18 are cross-sectional views of intermediate structures for a method of manufacturing a semiconductor device 200, in accordance with some embodiments. Some aspects of forming the semiconductor device 200 are similar to those of forming the semiconductor device 100, and thus are not repeated herein for simplicity and clarity.

Figure 12:
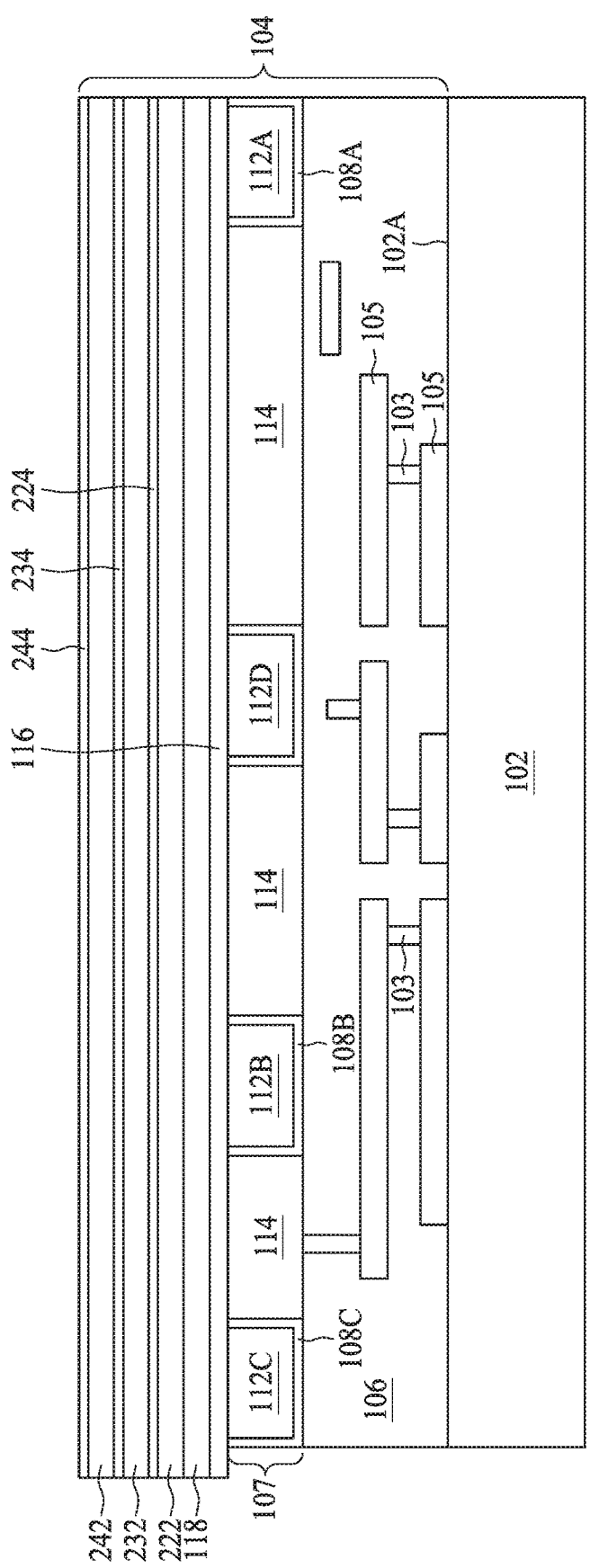
FIG. 12 to FIG. 18 are cross-sectional views of intermediate structures for a method of manufacturing a semiconductor device, in accordance with some embodiments.

Like reference numerals used across different figures indicate similar materials, configurations and features of the reference numerals among different figures. Referring to FIG. 12, the substrate 102 and the portion 106 of the RDL 104 are formed in succession. Next, the layer 107 and the protection layers 116 and 118 are sequentially formed over the portion 106. In addition to the conductive lines 112A through 112C, the layer 107 includes a conductive line 112D. The material and forming method of the conductive line 112D are similar to those of the conductive line 112A.

Still referring to FIG. 12, conductive layers 222, 232 and 242 and insulating films 224, 234 and 244 are formed alternately over the second protection layer 118. The conductive layers 222, 232 and 242 serve as capacitor electrodes and correspond to the conductive layers 122, 132 and 142, respectively, in the semiconductor device 100. The forming methods, geometries and materials of the conductive layers 222, 232 and 242 may be similar to those of the conductive layers 122, 132 and 142. However, no patterning operations are performed immediately following the blanket layer formation of the layers 222 and 232. The insulating films 224 and 234 serve as insulating materials electrically insulating the capacitor electrodes, and correspond to the insulating films 124 and 134 in the semiconductor device 100. The forming methods, geometries and materials of the insulating films 224, 234 and 244 may be similar to those of the insulating films 124 and 134. However, no patterning operations are performed immediately following the film formation. In some embodiments, the insulating film 244 may be formed of a dielectric material different from the insulating films 224 and 234, such as silicon oxide, silicon nitride, silicon oxynitride, or the like. In the present embodiment, the insulating film is formed of silicon nitride.

Figure 13:
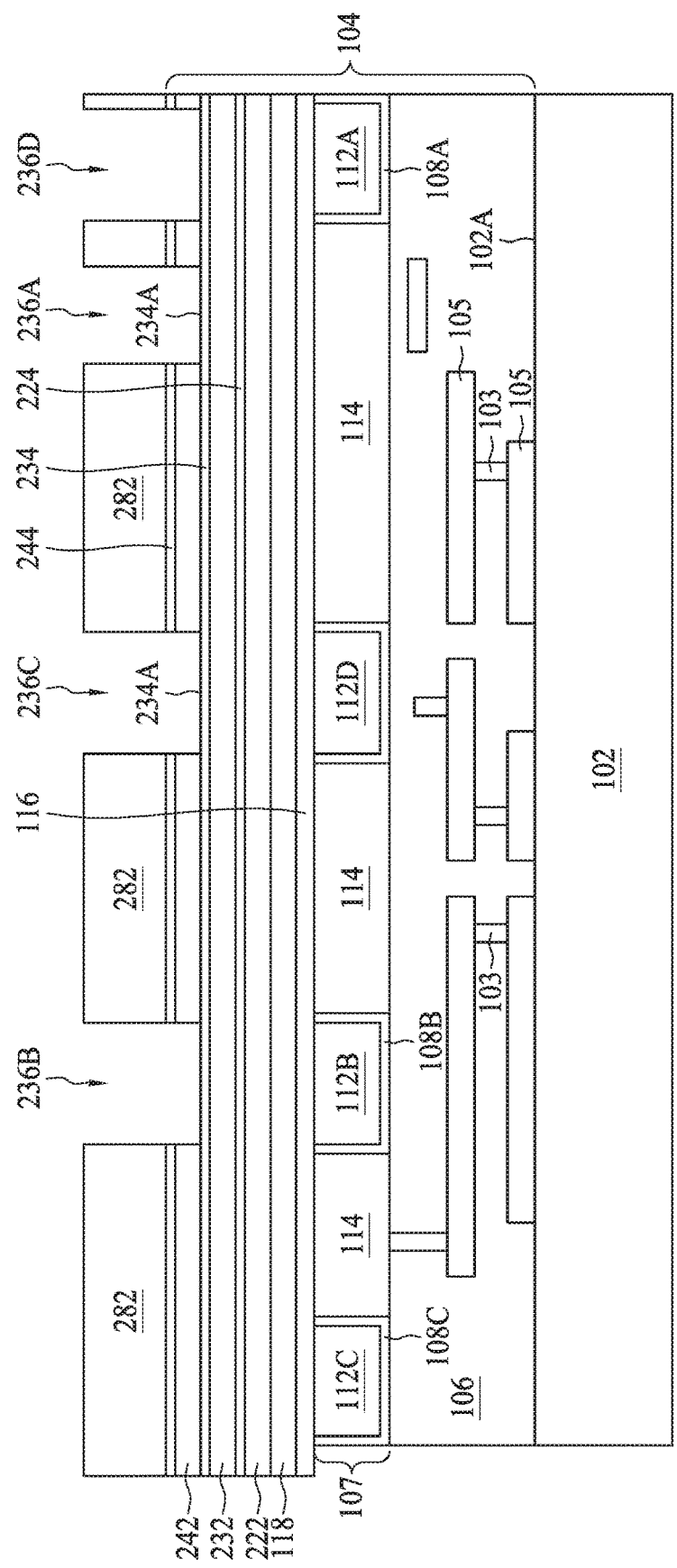

FIG. 13 through FIG. 16 illustrate patterning operations of the conductive layers 222, 232, and 242 and the insulating films 224, 234 and 244. Initially, a mask layer 282 is deposited over the insulating film 244, as illustrated in FIG. 13. The mask layer 282 may include a photoresist material. Alternatively, the mask layer 282 may include a dielectric material, such as oxide, nitride, oxynitride, or the like. The mask layer 282 may be, for example, spun on the surface of the insulating film 244, followed by a patterning operation. Accordingly, vias 236A, 236B, 236C and 236D are formed in the patterned mask layer 282. In an embodiment, the vias 236A through 236D may have a circular shape from a top view. In some embodiments, the vias 236A through 236D may have a polygonal shape from a top view, such as a rectangle. Next, an etching operation is performed to remove portions of the insulating film 244 and the conductive layer 242 with the mask layer 282 as mask. The etching operation may include a dry etch, a wet etch or a combination thereof. In some embodiments, the etch illustrated in FIG. 13 removes the insulating film 244 and the conductive layer 242. As a result, the vias 236A through 236D extend downwardly and portions of the upper surface 234A of the insulating film 234 are exposed, for example, the upper surfaces 234A in the vias 236A and 236C. Since the etch removes similar layers (i.e., the insulating film 244 and conductive layer 242) in forming different vias 236A through 236D, the variable factors of the etch operation can be easily managed such that the undesired over-etch or under-etch effect in different materials may be minimized. In some embodiments, when the etch operation is completed, the mask layer 282 may be removed.

Figure 14:
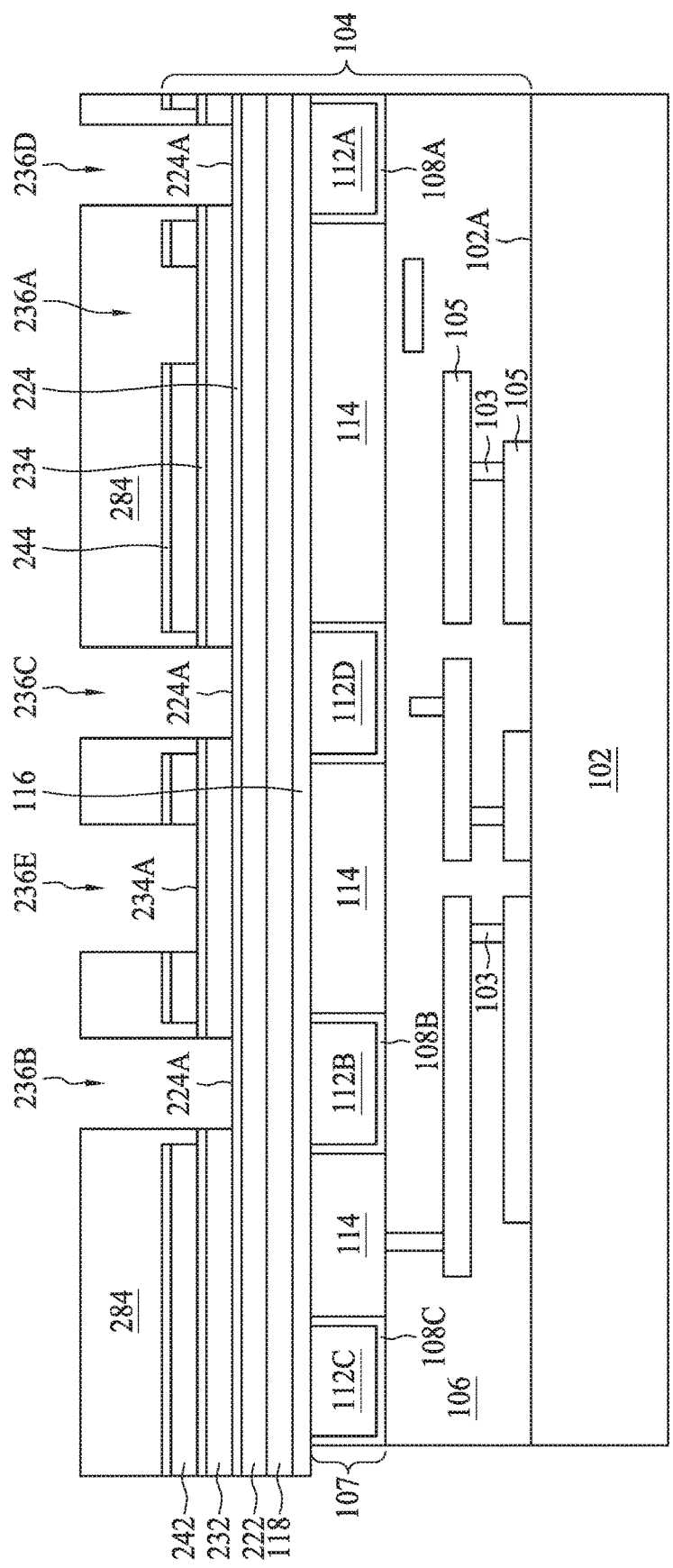

FIG. 14 shows a patterning operation of the insulating films 234 and 244 and the conductive layers 232 and 242. A mask layer 284 is deposited over the insulating film 244. The mask layer 284 may include a material similar to that of the mask layer 282. The mask layer 284 may be, for example, spun on the surface of the insulating film 244, followed by a patterning operation. The mask layer 284 covers portions of the insulating film 244 in the via 236A while keeping the vias 236B, 236C and 236D opened. Further, a new via 236E is formed between the vias 236B and 236C. In some embodiments, the via width of the via 236B, 236C or 236D in the mask layer 284 is less than its corresponding via width in the mask layer 282. Next, an etching operation is performed to remove portions of the insulating film 234 and the conductive layer 232 with the mask layer 284 as mask. The etching operation may include a dry etch, a wet etch or a combination thereof. The etch illustrated in FIG. 14 removes the insulating film 234 and the conductive layer 232 from the vias 236B, 236C and 236D. Accordingly, portions of the upper surface 224A of the insulating film 224 are exposed through the vias 236B, 236C and 236D. Similarly, the etch removes the insulating film 244 and the conductive layer 242 from the via 236E. Thus, a portion of the upper surface 234A of the insulating film 234A is exposed through the via 236E. A stepped shape, e.g., a two-step shape, for the vias 236B, 236C, 236D and 236E is obtained. In some embodiments, when the etching operation in FIG. 14 is completed, the mask layer 284 may be removed.

Figure 15:
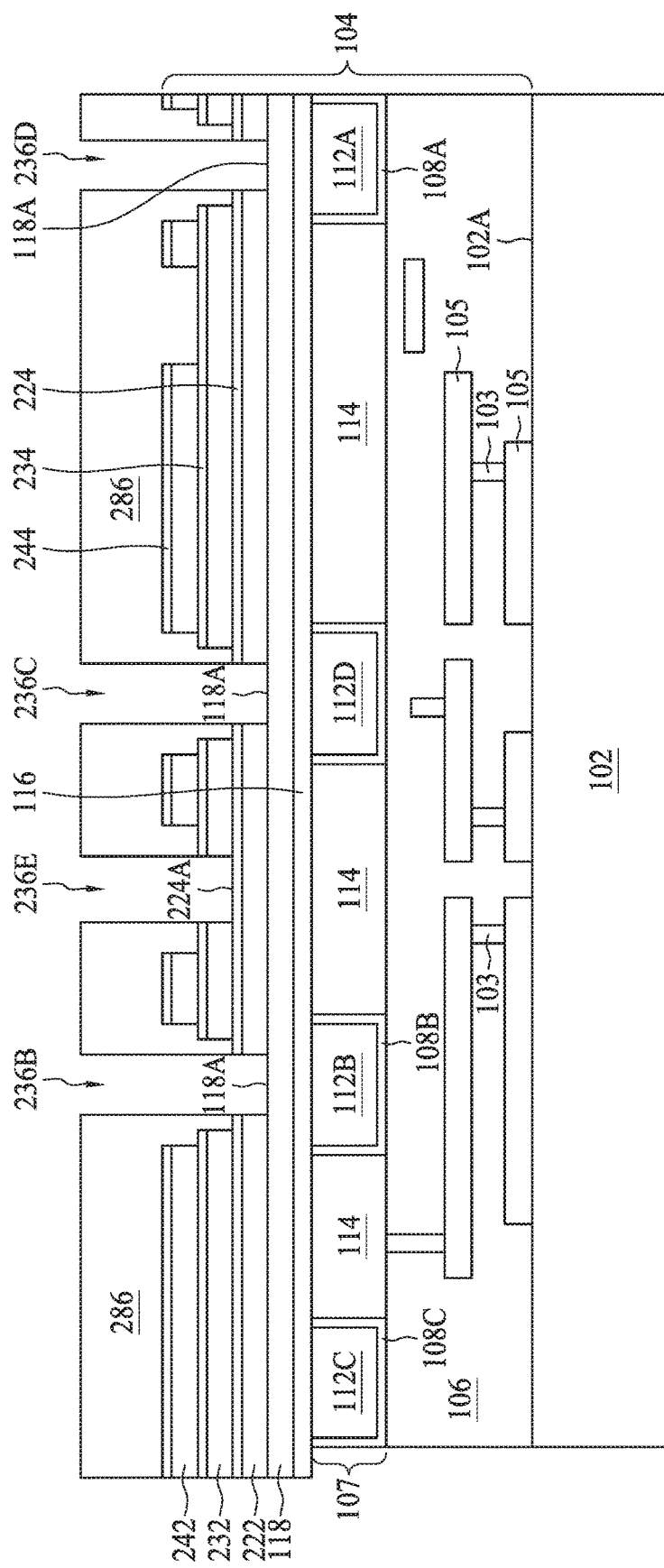

FIG. 15 shows a patterning operation of the insulating films 224 and 234 and the conductive layers 222 and 232. A mask layer 286 is deposited over the insulating film 244. The mask layer 286 may include a material similar to that of the mask layer 282 or 284. The mask layer 286 may be, for example, spun on the surface of the insulating film 244, followed by a patterning operation. The mask layer 286 covers the via 236A while keeping vias 236B, 236C, 236D and 236E open. In some embodiments, the via width of each of the vias 236B through 236E in the mask layer 286 is less than its corresponding via width in the mask layer 284. Next, an etching operation is performed to remove portions of the insulating film 224 and the conductive layer 222 with the mask layer 286 as mask. The etching operation may include a dry etch, a wet etch or a combination thereof. The etch illustrated in FIG. 15 removes the insulating film 224 and the conductive layer 222 from the vias 236B, 236C and 236D. Accordingly, portions of the upper surface 118A of the second protection layer 118 are exposed through the vias 236B, 236C and 236D. Similarly, the etch removes the insulating film 234 and the conductive layer 232 from the via 236E. Thus, a portion of the upper surface 224A of the insulating film 224A is exposed through the via 236E. A stepped shape, e.g., a three-step shape, for the vias 236B through 236E is obtained. In some embodiments, when the etching operation in FIG. 15 is completed, the mask layer 286 may be removed.

In some embodiments, the etch operations shown in FIGS. 14 and 15 may be merged. The etch may remove the insulating film 234, the conductive layer 232, the insulating film 224 and the conductive layer 222 using a single mask layer for forming the vias 236B through 236D. Similarly, the etch may remove the insulating film 244, the conductive layer 242, the insulating film 234 and the conductive layer 232 using a single mask layer for forming the via 236E. As a result, the vias 236B, 236C, 236D and 236E may exhibit a stepped shape, i.e., a two-step shape, different from that shown in FIG. 15. Since the combination of the layers to be etched for forming such two-step vias are similar for different vias, the variables of the etch operation can be easily managed such that the benefit of minimizing over-etch or under-etch effects can still be realized.

In the embodiment in which the etch operations in FIGS. 14 and 15 are merged, a total of only two etching steps is required for forming the vias 236A through 236E of the semiconductor device 200. In contrast, referring to FIGS. 3 to 7, the formation of each of the conductive layers 122, 132 and 142 of the semiconductor device 100 requires a respective patterning operation. The manufacturing operations of the semiconductor device 200 are thus beneficial in that one fewer etching step is needed. The processing cost and time, and the likelihood of particle contamination during the etching and accompanying surface cleaning operations, can be further reduced. In addition, the abovementioned processing advantage of the semiconductor device 200 is more pronounced in configurations having a greater number of the conductive layers. For example, in a six-layer configuration, forming conductive vias through the conductive layers of the semiconductor devices 100 and 200 may require six and three patterning operations, respectively.

Figure 16:
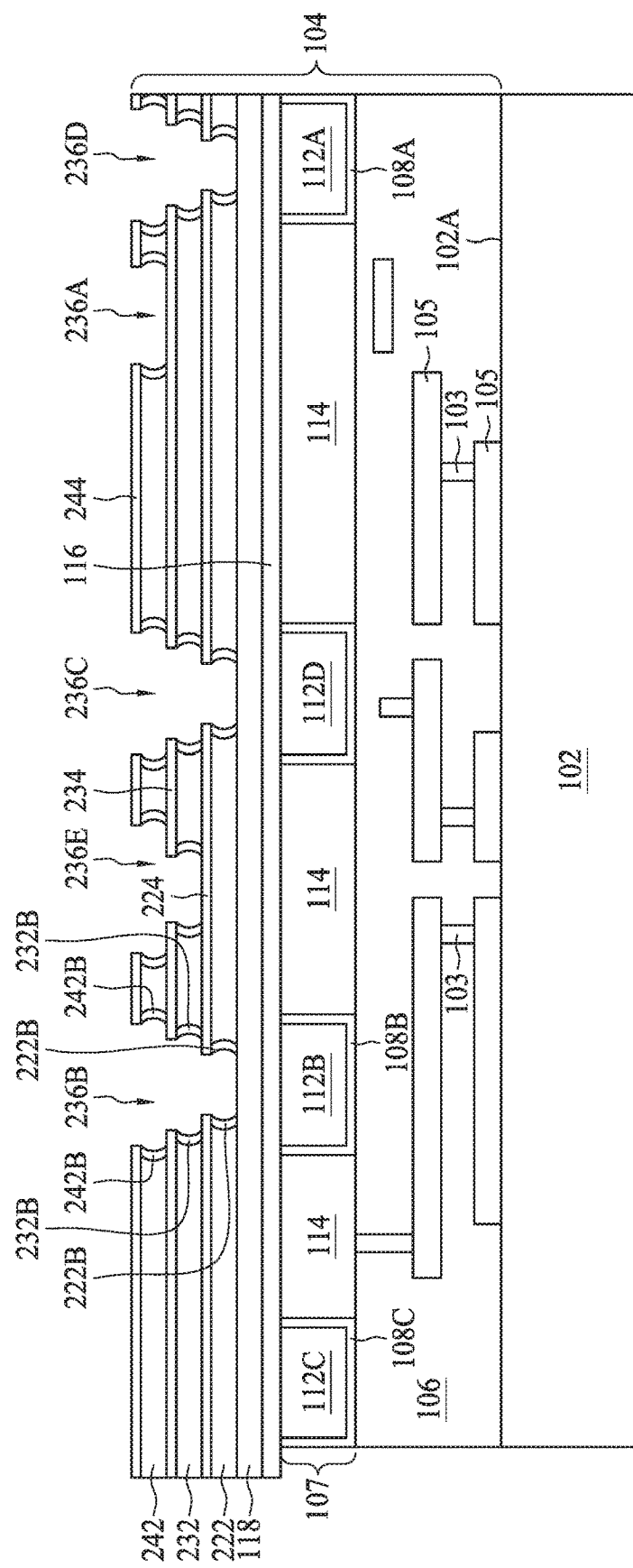

Referring to FIG. 16, an etching operation is performed on the conductive layers 222, 232, and 242. In some embodiments, the etch is a dry etch, a wet etch, or combinations thereof. In an embodiment, an isotropic etch is utilized to laterally encroach sidewalls of the vias 236A through 236F. In an embodiment, the etching operation may employ an etching gas, such as $Cl_2$ or the like. During the etching operation, the insulating films 224, 234 and 244 are kept substantially unetched. In an embodiment, the etch ratio of the conductive layers to the insulating films is between about 2.0 and about 20.0. The etched sidewalls of the conductive layers 222, 232 and 242 around the vias 236A through 236E may include a curved shape.

In some embodiments, an inactivation treatment is performed on the etched sidewalls of the conductive layers 222, 232 and 242. In an embodiment, a reacting gas, such as $N_2O$, is used for oxidizing a thickness of the conductive layer 222, 232 or 242 at its sidewalk. Accordingly, oxide films, for example titanium oxide films, labeled in FIG. 16 as 222B, 232B or 242B, are formed covering un-oxidized sidewalls of the conductive layers 222, 232 and 242 in the vias 236A through 236F. Such oxide films aid in preventing unintentional short circuit or leakage current between the conductive layers 222, 232 and 242 and neighboring features.

Figure 17:
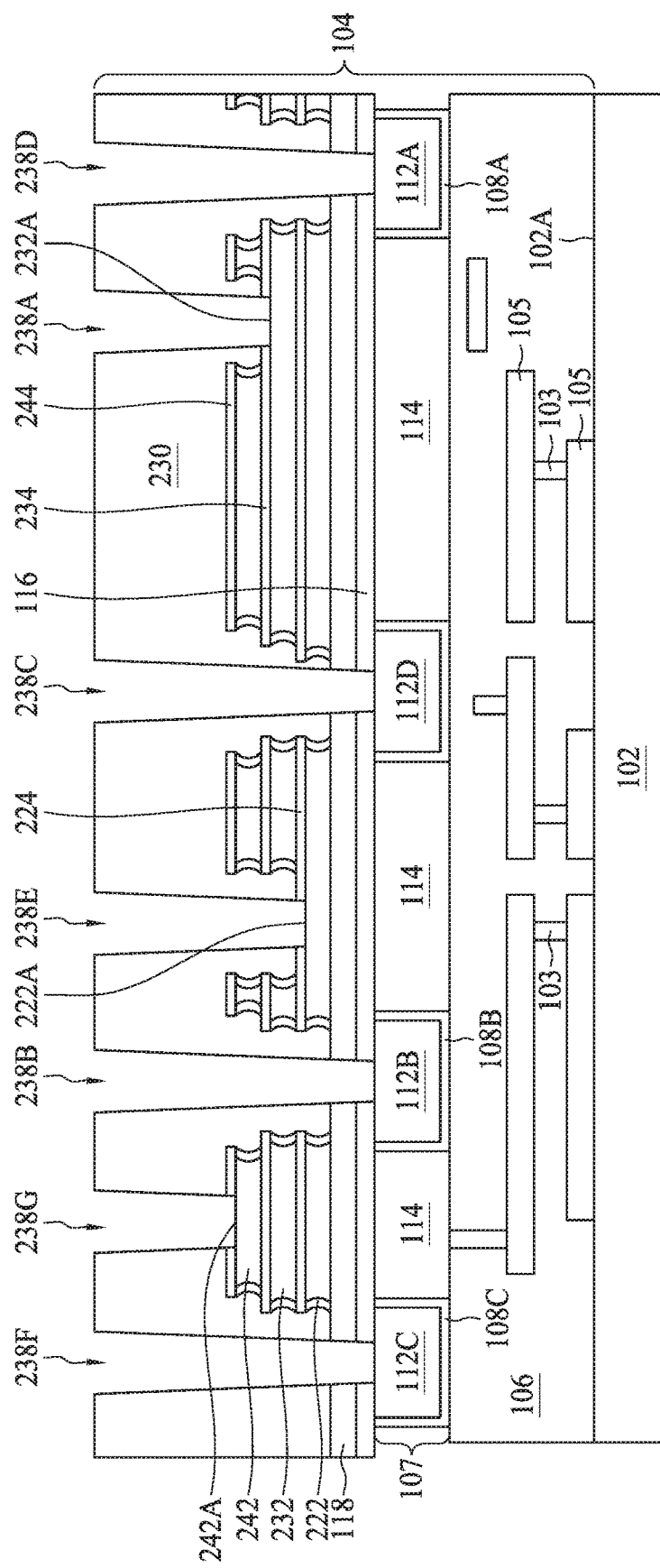

Referring to FIG. 17, an IMD 230 is formed over the insulating film 244. The IMD 230 may cover the insulating film 244 and fills the vias 236A through 236F. The material and forming method of the IMD 230 may be similar to those of the IMD 130. Subsequently, an etching operation is performed to form vias 238A through 238E in the IMD 230 that correspond to the locations of the vias 236A through 236E, respectively. Moreover, additional vias 238F and 238G are formed around the via 238B by the etching operation. The etching operation may include a dry etch and a wet etch operation. Each of the vias 238A through 238E has a via width less than the width of the corresponding via 236A through 236E. The etch removes the protection layers 118 and 116 such that the conductive lines 112A through 112D are exposed through the vias 238D, 238B, 238F and 238C, respectively. Furthermore, the etch removes the insulating films 222, 232 and 242 from the vias 238E, 238A and 238G, respectively, such that respective upper portions (e.g., 222A, 232A and 242A) of the conductive layers 222, 232 and 242 are exposed.

Figure 18:
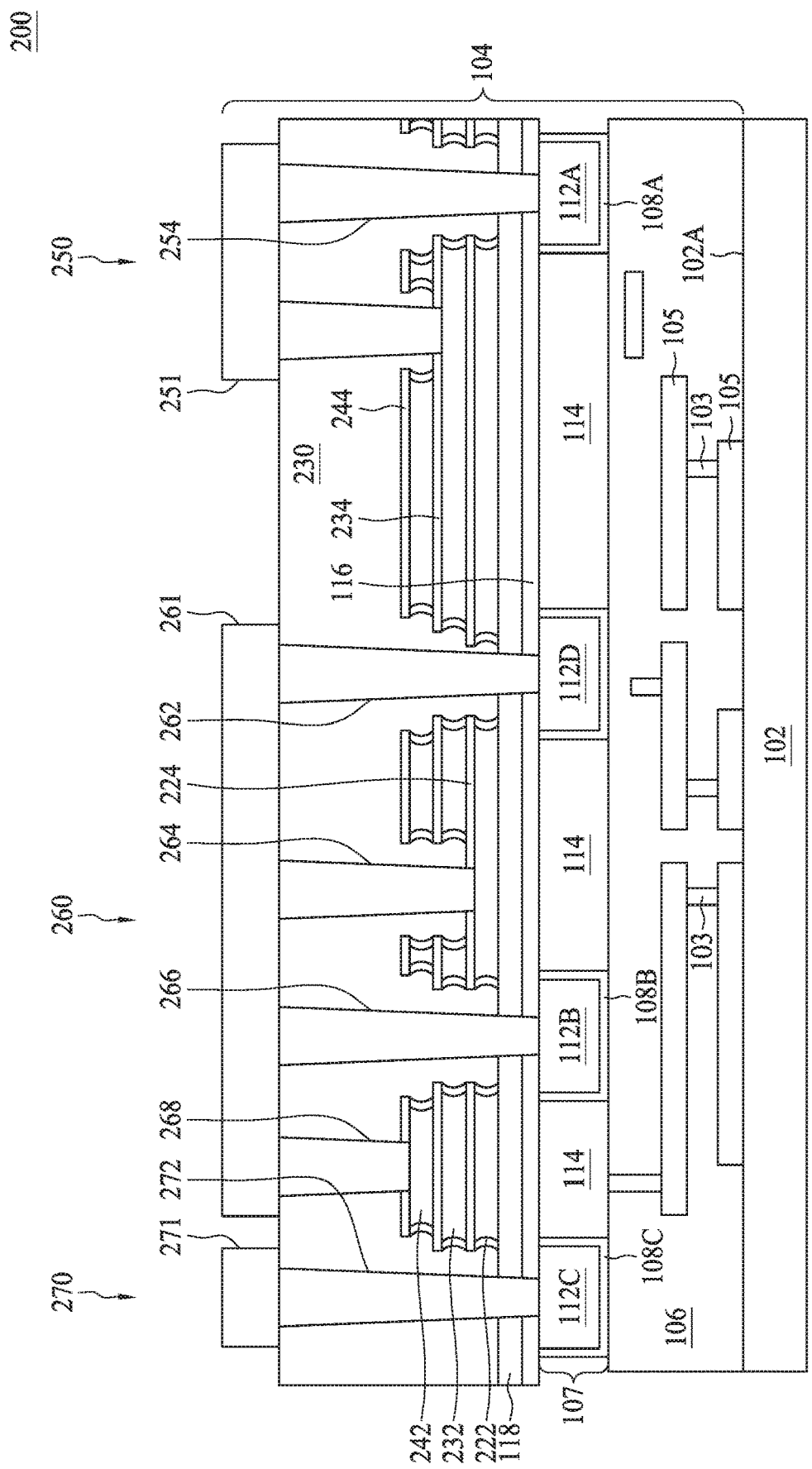

Subsequently, conductive structures 250, 260 and 270 are formed in the vias 238A through 238G, as shown in FIG. 18. A conductive material is initially deposited over the IMD 230 and in the vias 238A through 238G. The configurations and materials may be similar to the conductive structures 144A, 144B and 144C described and illustrated with reference to in FIG. 10. A patterning operation is performed to etch the conductive material, and thus the conductive structures 250, 260 and 270 are obtained. In an embodiment, the conductive structure 250, 260 or 270 may have a layered structure, for example, by including a seed layer similar to the seed layer 146A, 146B or 146C of the semiconductor device 100. The conductive structure 250 has a horizontal portion that conductively couples the vertical portions 252 and 254. The vertical portions 252 and 254 are formed as conductive vias through the IMD 230, the first protection layer 116 or the second protection layer 118. The conductive structure 250 conductively couples the conductive layer 232 with the conductive line 112A in which the conductive layer 232 is regarded as one of the capacitor electrodes. Existing schemes couple the conductive layer with the conductive via only via a sidewall of the conductive layer. Since the conductive via 252 contacts the conductive layer 232 from an upper surface of the conductive layer 232, a greater contact area can be obtained that reduces the contact resistance of the capacitor structure.

The conductive structure 260 includes a horizontal portion 261 over the IMD 230 to conductively couple the conductive layer 222 with the conductive layer 242 through vertical portions (conductive vias) 264 and 268. Through the conductive coupling, the conductive layers 222 and 242 are collectively regarded as the other electrode of the capacitor structure. In addition, the conductive structure 260 is conductively coupled to the conductive lines 112B and 112D through conducive vias 266 and 262. Since the conductive vias 264 and 268 contact the conductive layers 222 and 242 from an upper surface thereof, a greater contact area is obtained that reduces the contact resistance of the capacitor structure.

The conductive structure 270 includes a horizontal portion 271 over a vertical portion (conductive via) 272 that is conductively coupled to the conductive line 112C. The conductive route comprised of the conductive via 272 and conductive line 112C may be used for a logic device other than the capacitor structure. In an embodiment, the conductive via 272 is formed during an operation during which the conductive structures 150 and 160 are formed.

The horizontal portions 251, 261, and 271 of the conductive structures 250, 260 and 270 extend over the IMD 230. In an embodiment, the horizontal portions 251, 261, and 271 may have a circular shape or a polygonal shape from a top view. In some embodiment, the horizontal portions 251, 261, and 271 serve as contact pads or input/output pads of the semiconductor device 100 for conductively coupling with other devices. In an embodiment, the horizontal portions 251, 261, and 271 is in a topmost layer of the semiconductor device 200.

Figure 19:
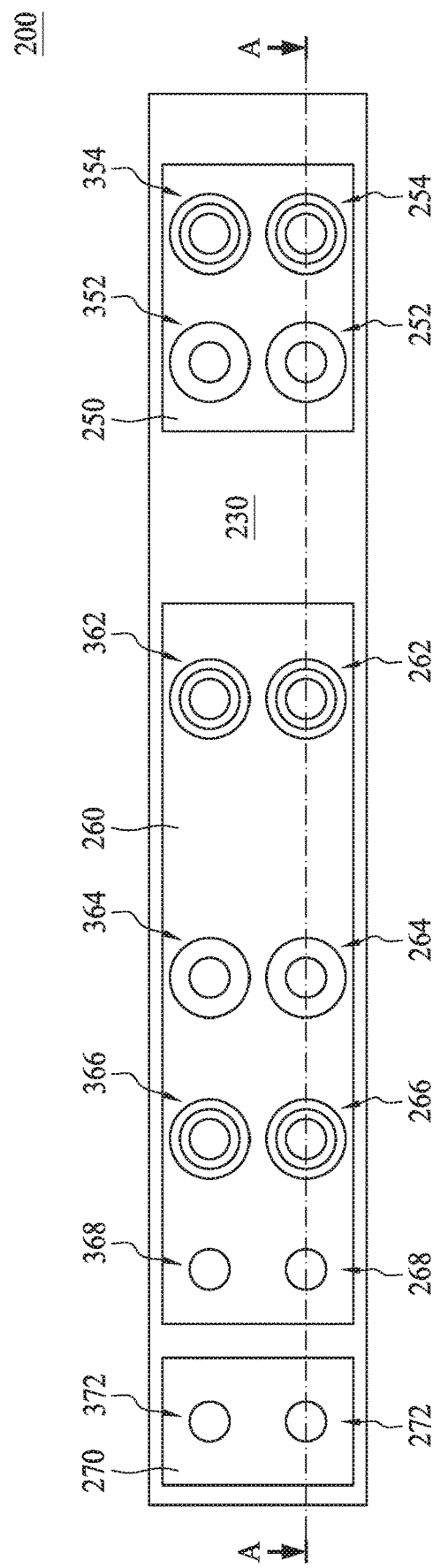
FIG. 19 is a schematic top view of the semiconductor device in FIG. 18, in accordance with some embodiments.

FIG. 19 is a schematic top view of the semiconductor device 200 in FIG. 18, in accordance with some embodiments. The cross-sectional view of the semiconductor device 200 in FIG. 18 are taken along sectional line AA in FIG. 19. Each of the conductive vias 252, 254, 262, 264, 266, 268 and 272 has a circular shape from a top view as an example. Each of the conductive vias may have a tapered sidewall. Some of the conductive vias may have concentric circles representing different via widths at different via levels. For example, the conductive via 254 has three progressively larger concentric circles denoting different via widths, labeled from bottom to top, at the conductive line 112A, the conductive layer 222, and the conductive layer 242, respectively. In the depicted embodiment, the semiconductor device 200 further includes conductive vias 352 and 354 for the conductive structure 250, conductive vias 362, 364 and 366 for the conductive structure 260, and conductive vias 368 and 372 for the conductive structure 270. The additional conductive vias can help increase conductive contact area of the capacitor structure with the RDL 104 and reduce the contact resistance further.

Referring to FIG. 10, the conductive layers 122, 132 and 142 extend into limited areas. This is because the conductive layers 122 and 124 are patterned so as to facilitate forming of the conductive via 144B, and the second conductive layer 132 is patterned to facilitate forming of the conductive via 144A. As a result, the overlapped region between the first electrode (comprised of the conductive layers 122 and 142) and the second electrode (comprised of the second conductive layer 132) is limited as compared to the entire electrode areas of the conductive layers 122, 132 and 142. In contrast, as shown in FIG. 18, gaps may be present between the conductive vias 252, 254, 262, 264, 266, 268 and 272 and the corresponding conductive layers 222, 232 and 242. The gaps are filled with the IMD 230. Such gaps may allow the conductive layers 222, 232 and 242 to extend horizontally with less restriction, in other words, the conductive layers 222, 232 and 242 almost fully overlap one another except in the locations of the conductive vias 254, 262, 264, 266, 268 and 272. The capacitive coupling between the first electrode (comprised of the conductive layers 222 and 242) and the second electrode (comprised of the second conductive layer 232) is increased accordingly. Therefore, a better capacitive performance of the semiconductor device 200 can be obtained.

The present disclosure provides a semiconductor structure, which includes a capacitor including a first electrode and a second electrode disposed over and electrically insulated from the first electrode. The semiconductor structure also includes a first conductive via extending through the first electrode and contacting a planar surface of the first electrode. The semiconductor structure further includes a second conductive via extending through the second electrode and contacting a planar surface of the second electrode.

The present disclosure provides a semiconductor structure. The semiconductor structure includes a first conductive layer and a second conductive layer over the first conductive layer. The first conductive layer partially overlaps and is electrically insulated from the second conductive layer. The semiconductor structure further includes a first dielectric layer between the first conductive layer and the second conductive layer and a second dielectric layer over the second conductive layer. The first conductive layer is at least partially overlapping the second conductive layer while electrically insulated from the second conductive layer by the first dielectric layer. The semiconductor structure also includes a first conductive structure having a conductive via extending through the second conductive layer, the first dielectric layer, and the second dielectric layer and terminating on a planar surface of the first conductive layer.

The present disclosure provides a method of manufacturing a semiconductor structure, including: providing a substrate; forming a first conductive layer over a substrate; depositing a first dielectric layer over the first conductive layer; forming a second conductive layer over the first dielectric layer; forming a second dielectric layer over the second conductive layer; forming a plurality of vias through the first conductive layer, the second conductive layer, the first dielectric layer and the second dielectric layer, at least one of the plurality of vias exposing an upper surface of the first conductive layer; and forming a conductive structure in the plurality of vias.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:
a capacitor comprising a first conductive plate, a second conductive plate and a third conductive plate, the second conductive plate electrically insulated from the first conductive plate and the third conductive plate, and each of the first conductive plate, the second conductive plate and the third conductive plate comprising a planar surface;
a first conductive via extending through the first conductive plate and the third conductive plate, and contacting the planar surface of the first conductive plate and the planar surface of the third conductive plate;
a second conductive via extending through the second conductive plate and contacting the planar surface of the second conductive plate; and
a conductive line below the first conductive plate, wherein the conductive line comprises an upper surface, wherein the first conductive via terminates on the upper surface of the conductive line.

2. The semiconductor structure according to claim 1, further comprising a dielectric layer electrically insulating the first conductive plate from the second conductive plate.

3. The semiconductor structure according to claim 1, wherein each of the first conductive via and the second conductive via comprises a stepped shape having a top portion and a bottom portion in which the top portion is wider than the bottom portion.

4. The semiconductor structure according to claim 1, wherein at least one of the first conductive plate and the second conductive plate comprises an angled sidewall.

5. The semiconductor structure according to claim 1, further comprising an insulating film electrically insulating the second conductive plate from the first and the third conductive plates, wherein the insulating film comprises a first portion, wherein the first portion contacts the first conductive plate and separates the first conductive via from the second conductive plate.

6. The semiconductor structure according to claim 5, wherein the first conductive plate comprises a second portion exposed through the first portion of the insulating film, and the insulating film covers an entirety of the second conductive plate.

7. The semiconductor structure according to claim 5, wherein the first conductive via and the second conductive via extend through the insulating film.

8. A semiconductor structure, comprising:
a semiconductor substrate; and
a redistribution layer disposed over and electrically coupled to the semiconductor substrate, the redistribution layer comprising:

a first conductive line and a second conductive line; and
a capacitor over the first conductive line and the second conductive line, the capacitor comprising:
  a first conductive plate;
  a first insulating film over the first conductive plate;
  a second conductive plate adjacent to the first conductive plate and electrically insulated from the first conductive plate by the first insulating film;
  a second insulating film over the second conductive plate;
  a third conductive plate over the second conductive plate and electrically insulated from the second conductive plate by the second insulating film, wherein each of the first conductive plate, the second conductive plate and the third conductive plate comprises a planar surface;
  a first conductive via extending through the first conductive plate and the third conductive plate, the first conductive via terminating on the first conductive line and contacting the planar surface of the first conductive plate and the planar surface of the third conductive plate; and
  a second conductive via extending through the second insulating film, the second conductive via terminating on the second conductive line and contacting the planar surface of the second conductive plate.

* * * * *